(12) United States Patent
Uchida et al.

(10) Patent No.: US 7,902,853 B2
(45) Date of Patent: Mar. 8, 2011

(54) SEMICONDUCTOR DEVICE, SEMICONDUCTOR DEVICE TESTING METHOD, AND PROBE CARD

(75) Inventors: Ren Uchida, Nara (JP); Masami Mori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 259 days.

(21) Appl. No.: 11/802,335

(22) Filed: May 22, 2007

(65) Prior Publication Data

US 2007/0296395 A1    Dec. 27, 2007

(30) Foreign Application Priority Data

Jun. 22, 2006  (JP) .................................. 2006-173133

(51) Int. Cl.
*G01R 31/26* (2006.01)
*G11C 29/00* (2006.01)

(52) U.S. Cl. ........................ 324/765; 324/770; 714/719

(58) Field of Classification Search ............... 324/76.55, 324/76.52, 76.39, 76.11, 765, 537, 500, 770, 324/763; 714/724, 733, 719

See application file for complete search history.

(56) References Cited

U.S. PATENT DOCUMENTS

| | | | |
|---|---|---|---|
| 5,230,001 A * | 7/1993 | Chandra et al. ............... | 714/744 |
| 5,347,145 A | 9/1994 | Tanaka et al. | |
| 6,617,873 B2 * | 9/2003 | Yokomizo ..................... | 324/769 |
| 6,629,277 B1 * | 9/2003 | Sanghani ...................... | 714/731 |
| 6,774,655 B2 * | 8/2004 | Matsuzaki et al. ............ | 324/763 |
| 6,876,185 B2 * | 4/2005 | Niratsuka ................... | 324/76.53 |
| 6,907,555 B1 | 6/2005 | Nomura et al. | |
| 7,183,788 B2 * | 2/2007 | Moore .......................... | 324/765 |
| 7,274,201 B2 * | 9/2007 | Attalla et al. ................. | 324/765 |
| 7,466,160 B2 * | 12/2008 | Ong et al. ..................... | 324/765 |
| 7,474,290 B2 * | 1/2009 | Makuuchi et al. ............. | 345/87 |
| 2002/0093874 A1 | 7/2002 | Ukon | |
| 2003/0007413 A1 | 1/2003 | Kodaira et al. | |
| 2003/0098859 A1 | 5/2003 | Udo et al. | |
| 2004/0004493 A1 | 1/2004 | Furukawa | |
| 2005/0276131 A1 | 12/2005 | Kim et al. | |
| 2006/0094162 A1 * | 5/2006 | Yabushita et al. ............ | 438/118 |
| 2007/0127300 A1 | 6/2007 | Kim et al. | |

FOREIGN PATENT DOCUMENTS

| | | |
|---|---|---|
| CN | 1392569 A | 1/2003 |
| JP | 2-128179 | 5/1990 |
| JP | 3-43735 | 4/1991 |
| JP | 04-218936 | 8/1992 |
| JP | 4-230045 | 8/1992 |
| JP | 05-183032 | 7/1993 |
| JP | 09-091996 | 4/1997 |
| JP | 10247208 A * | 9/1998 |
| JP | 11142471 A * | 5/1999 |

(Continued)

OTHER PUBLICATIONS http://en.wikipedia.org/wiki/Multiplexer.*

(Continued)

*Primary Examiner* — Hoai-An D Nguyen
(74) *Attorney, Agent, or Firm* — Harness, Dickey & Pierce, P.L.C.

(57) ABSTRACT

A test signal to be supplied to a driver section when the driver section is subjected to an operation test is generated by a test circuit. In the test circuit, the test signal can be generated by a burn-in control circuit in accordance with a clock signal TESTCK supplied from an outside source.

10 Claims, 17 Drawing Sheets

FOREIGN PATENT DOCUMENTS

| | | |
|---|---|---|
| JP | 2001-021612 | 1/2001 |
| JP | 2001-236797 | 8/2001 |
| JP | 2002-216496 | 8/2002 |
| JP | 2003-163246 A | 1/2003 |
| JP | 2003-249558 | 9/2003 |
| JP | 2005-327454 | 11/2005 |
| KR | 10-2005-0118417 | 12/2005 |
| KR | 10-2006-0021429 | 3/2006 |

OTHER PUBLICATIONS http://en.wikipedia.org/wiki/Multiplexing.*
http://www.wordwebonline.com/search.pl?w=generate.*

* cited by examiner

PROBE NEEDLES
DUT PROBE NEEDLES
PROBE-FIXING PEDESTAL

DISTANCE "A"
PROBE-FIXING PEDESTAL

PROBE NEEDLES
DUT

US 7,902,853 B2

SEMICONDUCTOR DEVICE, SEMICONDUCTOR DEVICE TESTING METHOD, AND PROBE CARD

This Nonprovisional application claims priority under U.S.C. §119(a) on Patent Application No. 173133/2006 filed in Japan on Jun. 22, 2006, the entire contents of which are hereby incorporated by reference.

FIELD OF THE INVENTION

The present invention relates to semiconductor devices (e.g., liquid crystal driving ICs) each having a large number of input terminals and output terminals. In particular, the present invention relates to a semiconductor device suitable for a multiple simultaneous measurement method.

BACKGROUND OF THE INVENTION

In recent years, the technical improvement of image display devices has made it possible to display precise CG (computer graphics) images and fully realistic high-definition images of nature. However, there has been a daily growing demand that higher gradation and higher definition images should be displayed.

Further, since image display devices have been applied to every field, e.g., to on-board units and medical devices as well as household appliances, there has been a very high demand for qualities including reliability. A liquid crystal panel serving as a liquid crystal display device has also been increasingly required to display higher definition images, so that a liquid crystal driver LSI to be provided in the liquid crystal panel has been made to have more outputs and to provide more gradations.

In order to carry out this gradation display, a liquid crystal driver has outputs each containing a DA converter and each designed to output a gradation voltage. This operation is a little more fully explained below. First, see FIG. 12, which shows a structure of a conventional liquid crystal driver.

The liquid crystal driver shown in FIG. 12 sequentially samples input data (6 bits or more/1 output) respectively corresponding to liquid crystalline system outputs, loads and latches data corresponding to the number of outputs, and input the data to DA converters via a level shifter. Since this liquid crystal driver is a well-known structure, its operation is not fully explained.

Each of the DA converters selects a gradation level for each output, and outputs, via an operational amplifier provided for each output, a gradation level generated by a reference voltage generation circuit (ladder resistor). FIG. 13 shows the ladder resistor that is to be used as the reference voltage generation circuit. Generally, a desired gradation level is generated for each gradation by dividing the ladder resistor into resistors.

As for the aforementioned input data, a 6-bit DAC, an 8-bit DAC, and a 10-bit DAC make it possible to display 64 gradations, 256 gradations, and 1024 gradations, respectively.

As an LSI for use as a liquid crystal driver has been made to provide more gradations, high-precision measurement has become indispensable when the liquid crystal driver is tested for the securement of its quality. That is, a more highly precise test needs to be conducted to see whether gradation voltages respectively outputted from DA converters are all correct and whether the gradation voltages are equal to one another.

If devices under test DUT have the same power supply voltage, then measurement accuracy needs to be quadrupled in cases where the performance of output terminals has been improved from 64 gradations to 256 gradations.

The following explains an example of a method for testing an LSI for use as a liquid crystal driver as a device under test DUT. Assume that the device under test DUT is an LSI for use as a liquid crystal driver having m output terminals each containing an n-gradation DA converter for selecting and outputting one of n voltage levels.

FIG. 14 is a diagram schematically showing a gradation testing method (system configuration) using a high-precision voltmeter. This system is constituted by a device under test DUT and a semiconductor testing device (tester).

The semiconductor testing device inputs a predetermined input signal to the device under test DUT, and determines whether an output signal from the DUT is good or bad. In the foregoing system configuration, a first-gradation level is outputted by supplying a predetermined input signal to the device under test DUT (i.e., the liquid crystal driver) with the use of the semiconductor testing device (tester).

Thereafter, the high-precision analog voltmeter is used to sequentially measure a first-gradation voltage for each output until the mth output, and the measurement results are sequentially stored in a memory contained in the semiconductor testing device (tester).

This operation is repeated the number of times corresponding to the number of gradations n. Finally, data corresponding to all the outputs and all the gradations are stored in the memory. As a result, data corresponding to the number obtained multiplying the number of gradations n by the number of outputs m are stored.

The data stored in the memory are subjected to a predetermined calculation with the use of a calculation device contained in the semiconductor testing device (tester), and a test is conducted on the shift length by which gradation voltages of each output terminal are shifted from one another and on the variations (uniformity) in gradation voltage among the output terminals.

In such a liquid crystal driver test, an increase in the number of gradations makes it necessary to more highly precisely measure gradation voltages.

As evidenced by the above explanation, basic test items to be conducted in testing a liquid crystal driver according to the foregoing method include a test item as to whether a voltage of each output terminal falls within a desired range for each gradation and a test item as to whether a variation between terminals falls within a desired range.

Furthermore, supplementary test items to be conducted in addition to the basic test items include: a functional test on basic operation; a test on AC characteristics such as an operation margin, consumption current, and delay time; a test on minute leak current; and other tests.

These tests are designed to detect a defect in a liquid crystal driver. In addition, it is necessary to improve screening accuracy by revealing a potential defect factor. As described above, liquid crystal drivers are applied to products such as on-board units and medical devices as well as household appliances, and there has been a very difficult request for qualities including reliability.

In order to respond to a request for the higher quality of devices in addition to the improved function of devices, it has become necessary to conduct a burn-in test for revelation of a potential defect. At present, a burn-in test on liquid crystal drivers is conducted with the liquid crystal drivers taking the form of a package or a wafer.

The following fully explains a case where a burn-in test is conducted on liquid crystal drivers taking the form of a wafer.

As described above, a liquid crystal driver sequentially samples input data (6 bits or more/1 output) respectively corresponding to liquid crystalline system outputs, loads and latches data corresponding to the number of outputs, and input the data to DA converters via a level shifter. Each of the DA converters selects a gradation level for each output, and outputs, via an operational amplifier provided for each output, a gradation level generated by a reference voltage generation circuit (ladder resistor).

In a burn-in test, a circuit is entirely activated by carrying out the foregoing operation at overload (under a desired voltage condition and in a hot environment, etc.). By conducting such a burn-in test for a predetermined period of time, it is possible to reveal a potential defect factor in each chip.

In a burn-in test, output terminals for a status monitor are needed in addition to input data for setting gradation levels, a power supply, and a ground. For example, in case of an 8-bit (256-gradation) driver, a total of 52 signal supply inputs are needed.

After the burn-in test has been conducted, the aforementioned test for detection of a defect is conducted. By conducting the tests in such a flow, it is possible to respond to a request for the high quality of devices.

The duration of the test for detection of a defect can be reduced in various special ways. However, how long devices under test are activated is the key to a burn-in test for revealing a potential defect by activating the interior of the devices under test. Even in various special ways, it is difficult to reduce the time during which each of the devices under test is activated, and such a time reduction causes a decrease in test capacity and an increase in test cost.

Here, an effective way to reduce the time and cost required for a burn-in test is to conduct a simultaneous burn-in test on a large number of devices (such a simultaneous burn-in test being hereinafter referred to as "multiple simultaneous test"). However, as described above, a recent liquid crystal driver made to have more outputs and to provide more gradations has a large number of input terminals and output terminals (especially input terminals). This makes it difficult to conduct a multiple simultaneous test.

That is, a semiconductor device, typified by a liquid crystal driver, which includes a large number of input terminals, output terminals, and power supply terminals has a large number of terminals. Therefore, in testing a large number of such semiconductor devices simultaneously, test signal terminals (hereinafter referred to as "pin electronics (PEs)") of a semiconductor testing device are used. For this reason, the number of PEs of a testing device restricts the number of semiconductor devices to be subjected to a multiple test.

Further, in testing a semiconductor device fabricated on a wafer, a wafer probe card (WPC) is used via which a PE of a semiconductor testing device and an electrode terminal of a semiconductor device to be tested are electrically connected to each other. However, a connection of a large number of probe needles onto the electrode terminal causes a shortage of physical space in which the needles are mounted, thereby making it difficult to realize a WPC that makes it possible to conduct a multiple test. For this reason, the more terminals a semiconductor device has, the more difficult it is to conduct a multiple simultaneous test. This is explained below with reference to FIGS. 15 and 16.

FIGS. 15(a) and 15(b) show a structure of a probe card 110 being used for conducting a normal function single test on a conventional liquid crystal driver 100. In FIGS. 15(a) and 15(b), the probe card 110 and the liquid crystal driver 100 are in contact with each other. FIG. 15(a) is a top view of the probe card 110, and FIG. 15(b) is a side view of the probe card 110.

The probe card 110 includes input-terminal-side probe needles 111, output-terminal-side probe needles 112, a probe card substrate 113, and probe-fixing pedestals 114. In a test on the liquid crystal driver 100, the input-terminal-side probe needles 111 for controlling the liquid crystal driver 100 and the output-terminal-side probe needles 112 for voltage-driving the liquid crystal are electrically connected to an external tester, and the liquid crystal driver 100 is subjected to an operation test.

All the signals necessary for causing the liquid crystal driver 100 to operate are inputted to the liquid crystal driver 100 from an outside source; therefore, a probe card to be used for the liquid crystal driver 100 needs to have probe needles respectively corresponding to all the input terminals of the liquid crystal driver 100. If the liquid crystal driver 100 is identical in structure to a driver section 10 shown in FIG. 1, then a total of 52 input-terminal-side probe needles 111 respectively corresponding to all the input terminals (namely a CK terminal, an SP terminal, 48 DATA terminals, a REV terminal, and an LS terminal) are needed. These input-terminal-side probe needles 111 are provided so as to correspond to a longer side (left in the figure) of the liquid crystal driver 100.

Further, the output-terminal-side probe needles 112 are similarly provided so as to correspond to a longer side (right in the figure) of the liquid crystal driver 100, which longer side is opposite the longer side to which the input-terminal-side probe needles 111 are provided so as to correspond. Further, a mainstream type of current liquid crystal driver includes a total of 384 to 720 output terminals, and the optimum number of output terminals is selected depending on various uses of panels.

The probe needles 111 and 112 are fixed to the probe card substrate 113 via the probe-fixing pedestals 114, and tips of the probe needles 111 and 112 and input pads of the liquid crystal driver 100 are brought into contact with each other so as to be electrically connected to each other, respectively. Thus, a test is conducted on the input terminals and output terminals of the liquid crystal driver 100 by bringing all the device-specified input and output terminals into contact respectively with the probe needles 111 and 112 of the probe card 110.

As shown by the foregoing condition of contact, in conducting a multiple simultaneous test, the number of probe needles needs to correspond to the number obtained by the number of all probe needles per liquid crystal driver by the number of DUTs (devices under test). Under conditions where DUTs are brought into contact for a normal test, a multiple simultaneous test becomes difficult due to restrictions imposed by the problem of physical space in which the probe needles are mounted and the method for fixing the probe needles.

In cases where a test on the liquid crystal driver 100 is a burn-in test, it is possible, as shown in FIG. 16, that only the input-terminal-side probe needles 111 are brought into contact with the liquid crystal driver 100. That is, the purpose of a burn-in operation is to serve as a commonly-known technique to put operation stress on a DUT, and to achieve early revelation of a progressive defect mode. Therefore, in a burn-in test, it is only necessary to control operation of the liquid crystal driver 100 serving as a DUT, so that it is only necessary to set the input-terminal-side probe needles 111. However, as described above, even with a probe card 110 having 52 input-terminal-side probe needles 111, it is difficult to conduct a multiple simultaneous burn-in test.

Japanese Unexamined Patent Application No. 218936/2004 (Tokukaihei 4-218936; published on Aug. 10, 1992; hereinafter referred to as "Patent Document 1") discloses a semiconductor device for use as a liquid crystal driver, into which semiconductor device a burn-in control circuit is incorporated in order to reduce the number of input terminals for use in burn-in operation control. FIG. 17 is a diagram showing a semiconductor device, disclosed in Patent Document 1, which is used as a liquid crystal driver.

The liquid crystal driver of Patent Document 1 is arranged as follows. That is, the liquid crystal driver is set to a test mode when a test signal is inputted to the NTEST terminal. Then, the CR oscillation circuit 120 causes self-oscillations of the liquid crystal driver. In accordance with the self-oscillation clock, the burn-in control circuit 130 generates a test signal. This makes it possible to conduct a burn-in test without supplying a test control signal to a large number of logic input terminals from an outside source.

However, the internal state of the liquid crystal driver of Patent Document 1 is set in accordance with the clock signal generated due to the self-oscillations, the liquid crystal driver cannot be set to a given state at a given timing. Further, the frequency is fixed. This causes such a problem that an IDDQ test for securement of high quality cannot be conducted in a given state. The "given state" refers, for example, to a case where a memory cell is set to 1 or 0, and high quality can be secured by conducting an IDDQ test in each state. Further, high quality can be further secured by conducting an IDDQ test with an adjacent bit set as an inversion bit.

Furthermore, the liquid crystal driver of Patent Document 1 is designed to simplify a device structure needed for a burn-in test, and is not designed for a multiple simultaneous test on a large number of devices under test. As a matter of fact, it is impossible to conduct a multiple simultaneous test on a large number of such liquid display drivers. The reason for this is as follows.

See a case where an attempt is made to conduct a multiple simultaneous test on a large number of liquid crystal drivers of Patent Document 1. In this case, even when input signals to the drivers are synchronized, subsequent operation in each driver is based on a clock signal generated due to self-oscillations of the driver. Therefore, output signals from the drivers cannot be synchronized. In a multiple simultaneous test, output signals from the drivers need to be synchronized. Therefore, it is impossible to conduct a multiple simultaneous test on a large number of liquid crystal drivers of Patent Document 1.

Thus, semiconductor devices such as liquid crystal drivers have been applied to fields, such as automobiles and medical devices as well as conventional game machines and portable electronic devices, in which high reliability is required. For securement of high quality, it has become necessary to introduce a burn-in test that requires a long inspection time. However, as described above, the conventional technique cannot make it possible to conduct a multiple simultaneous burn-in test. This causes an increase in time required for an inspection process. This makes it difficult to respond to customers' demands in terms of shipping date, high quality, and product price.

SUMMARY OF THE INVENTION

The present invention has been made in view of the foregoing problems, and it is an object of the present invention to realize semiconductor devices on which a high-quality multiple simultaneous test can be easily conducted.

In order to attain the foregoing object, a semiconductor device according to the present invention is a semiconductor device, including: a main operation section; and a test signal generating section for generating a test signal that is to be supplied to the main operation section when the main operation section is subjected to a quality determination test, the test signal generating section being capable of generating the test signal in accordance with a test enable signal and a clock signal each inputted from an outside source. Note that the main operation section is an operation part for realizing the original function (normal-operation function) of the semiconductor device.

According to the foregoing arrangement, in cases where the semiconductor device is subjected to a quality determination test as a device under test (DUT), a test signal necessary for this quality determination test is generated by a test signal generating section. The test signal generating section is capable of generating the test signal in accordance with a test enable signal and a clock signal each supplied from an outside source. Therefore, in cases where the main operation section requires a large number of input signals for its operation, the number of test input signals can be greatly reduced. This makes it possible to solve such a problem that it becomes difficult to dispose probe needles in cases where a multiple simultaneous test is conducted.

Further, the test signal generating section operates in accordance with a clock signal supplied from an outside source, it is easy to synchronize signals inputted to and outputted from a DUT, and it is also easy to synchronize respective outputs of DUTs in cases where a multiple simultaneous test is conducted. When it becomes easy to synchronize signals inputted to and outputted from a DUT, it becomes easy to control operation of the DUT in a test. This makes it easy to conduct a high-quality quality determination test.

In order to attain the foregoing object, a semiconductor device testing method according to the present invention is a method for testing a semiconductor device which includes (i) a main operation section and (ii) a test signal generating section for generating a test signal that is to be supplied to the main operation section when the main operation section is subjected to a quality determination test, the method including the steps of: inputting a test enable signal and a clock signal to the test signal generating section from an outside source; causing the test signal generating section to generate the test signal in accordance with the test enable signal and the clock signal; and conducting the quality determination test on the main operation section.

Further, a probe card according to the present invention is a probe card to be used when a quality determination test is conducted on a semiconductor device which includes (i) a main operation section and (ii) a test signal generating section for generating a test signal that is to be supplied to the main operation section when the main operation section is subjected to the quality determination test, the test signal generating section of the semiconductor device being capable of generating the test signal in accordance with a test enable signal and a clock signal each inputted from an outside source, the probe card including probe needles for making contact with terminal pads that are to be respectively used for the test enable signal and the clock signal, the probe needles being disposed so as not to overlap one another when seen from a direction of a line normal to a surface of the semiconductor device on which surface the pads are disposed.

Examples of such an arrangement include an arrangement in which the probe needles are disposed so as to be parallel to one another when seen from the direction of the line normal to the surface of the semiconductor device on which surface the pads are disposed.

According to the foregoing arrangement, in cases where a multiple simultaneous test is conducted, probe needles via which a test control signal is inputted to a semiconductor device are disposed so as not to overlap one another when seen from above, so that a large number of probe needles provided in a probe card are effectively prevented from interfering with one another.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 3(a) is a top view of the wafer probe card, and FIG. 3(b) is a side view of the wafer probe card.

FIG. 5(a) is a side view of a multilayer needle-fixed structure in which the probe needles are so fixed as to overlap one another when seen from above, and FIG. 5(b) is a top view of the multilayer needle-fixed structure. FIG. 5(c) is a side view of a planar needle-fixed structure in which the probe needles are so fixed as not to overlap one another when seen from above, and FIG. 5(d) is a top view of the planer needle-fixed structure.

FIG. 15(a) is a top view of the wafer probe card, and FIG. 15(b) is a side view of the wafer probe card.

DESCRIPTION OF THE EMBODIMENTS

An embodiment of the present invention will be described below with reference to the drawings. The present embodiment shows a liquid crystal driver as an example of a semiconductor device of the present invention. However, the type of semiconductor device that can be applied in the present invention is not particularly limited. Further, a burn-in test is shown as an example of a test that is to be conducted on semiconductor devices in the following description. However, the present invention can be applied to other operation tests (quality determination tests).

Figure 1:
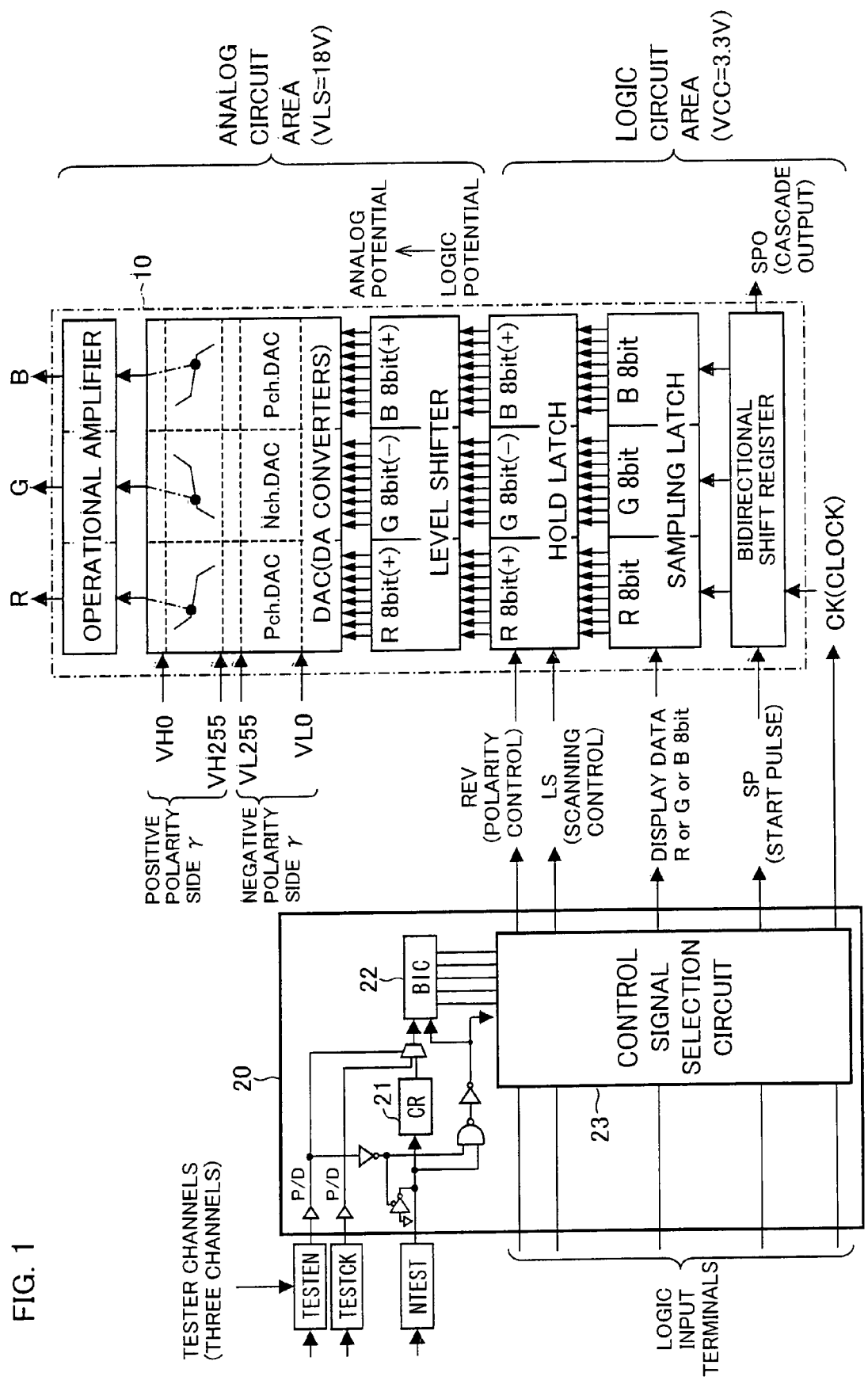
FIG. 1 shows an embodiment of the present invention, and is a block diagram showing a structure of a main part of a liquid crystal driver.

FIG. 1 is a diagram schematically showing a structure of a liquid crystal driver 1 according to the present embodiment. The liquid crystal driver 1 is characterized by adding a test circuit 20 to a driver section 10. The driver section 10 includes a shift register, a sampling memory, a hold memory, a level shifter, a DA converter, an output amplifier, and the like. However, the structure is no different from a well-known liquid crystal driver, and therefore is not fully explained here.

The driver section 10 operates upon receiving various control signals (e.g., a clock signal CK, a start pulse signal SP, a polarity control signal REV, and a scanning control signal LS) and display signals RGB. For this reason, the driver section 10 needs a large number of signal input terminals. For example, assuming that each of the display signals RGB has a 8-bit signal, the driver section 10 needs 52 signal input terminals.

As described above, an attempt to input such a large number of signals from an outside source in an operation test on liquid crystal drivers causes too large an increase in the number of PEs via which test signals are inputted, thereby making it difficult to conduct a multiple simultaneous test.

Figure 2:
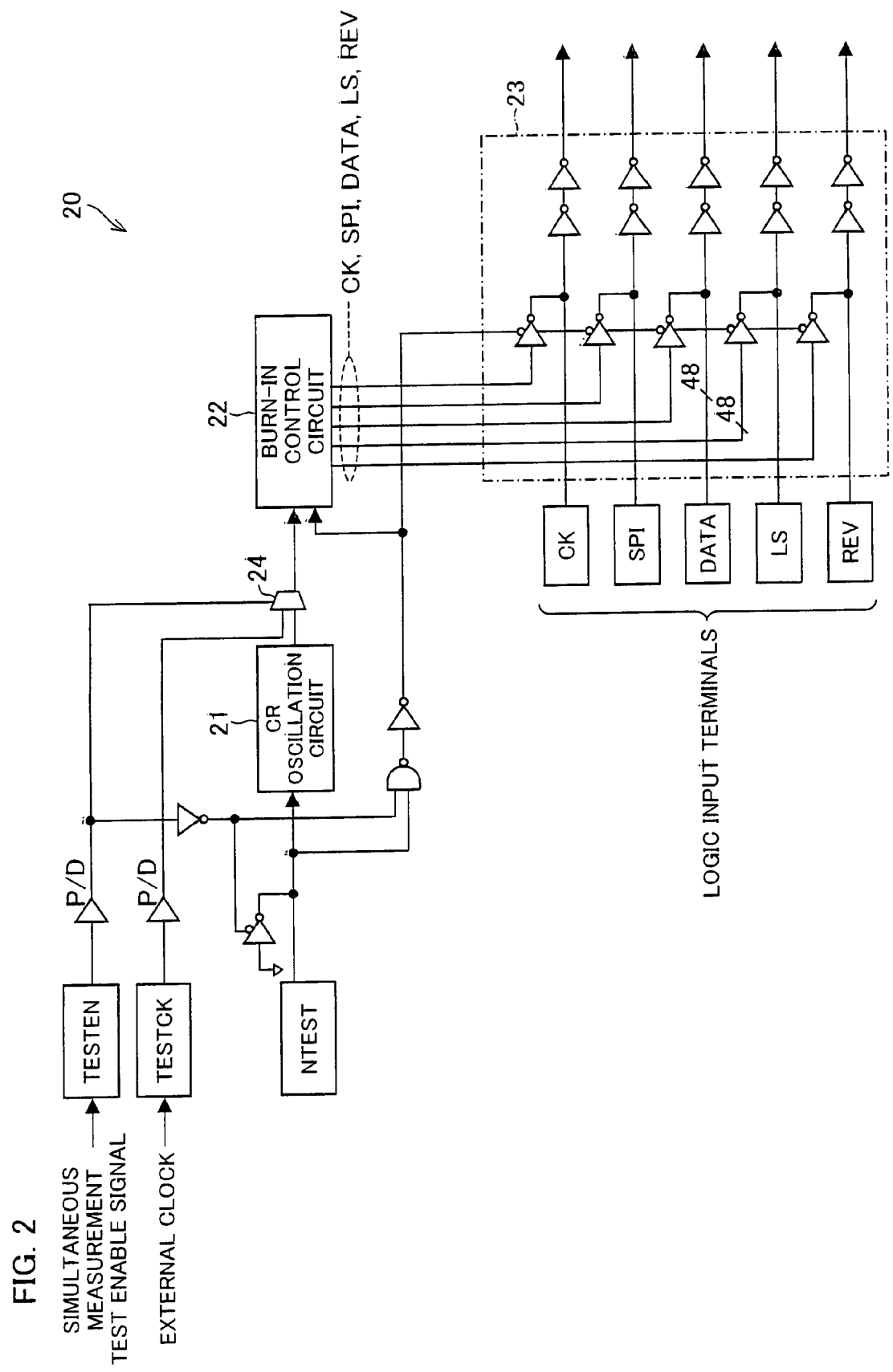
FIG. 2 is a diagram showing a structure of a test circuit contained in the liquid crystal driver.

For this reason, by including the test circuit 20, the liquid crystal driver 1 makes it possible to conduct a test with a small number of input signals. As shown in FIG. 2, the test circuit 20 includes a clock oscillation circuit (CR oscillation circuit) 21, a burn-in control circuit (BIC) 22, and a control signal selection circuit 23. Further, the test circuit 20 makes it possible to conduct an operation test on the driver section 10 upon receiving TESTEN, TESTCK, and NTEST via three tester channels, respectively. The liquid crystal driver 1 can be subjected to (i) a burn-in test identical to that of Patent Document 1 (such a burn-in test being hereinafter referred to as "self burn-in test") and (ii) a burn-in test suitable to a multiple simultaneous test (such a burn-in test being hereinafter referred to as "control burn-in test").

TESTEN indicates a simultaneous measurement test enable signal and an input terminal via which the signal is inputted. The TESTEN signal is High while a control burn-in test is conducted. TESTCK indicates a test clock signal and an input terminal via which the signal is inputted, and is an external clock signal for use in a control burn-in test. NTEST indicates a signal for choosing whether the clock oscillation circuit 21 oscillates or stops and an input terminal via which the signal is inputted (here, the clock oscillation circuit 21 oscillates when NTEST is Low). Table 1 shows how the liquid crystal driver 1 is operated when the TESTEN signal, the TESTCK signal, and the NTEST signal are High/Low.

TABLE 1

| Mode | NTEST | TESTEN | TESTCK | Operation Mode | Logic Input | Internal CR Oscillation Operation |
|---|---|---|---|---|---|---|
| ① | L | L | — | Self Burn-in | BIC Control | Self-oscillation |
| ② | H | L | — | Normal Operation (Burn-in to be Determined) | Open (Control by Use of Tester) | Stop |
| ③ | H | H | External CK Input | Control Burn-in | BIC Control | Stop |

First, in cases where the TESTEN signal and the NTEST signal are both Low, a self burn-in test is conducted. On this occasion, since the NTEST signal is Low, the clock oscillation circuit 21 oscillates, and outputs a self-oscillation clock to the burn-in control circuit 22. In a self burn-in test, a test clock signal is generated by the clock oscillation circuit 21. Therefore, no TESTCK signal needs to be inputted from an outside source.

Further, the burn-in control circuit 22 generates a test control signal, and outputs the test control signal to the driver section 10 via the control signal selection circuit 23. Examples of test control signals to be generated by the burn-in control circuit 22 include various control signals (e.g., a clock signal CK, a start pulse signal SP, a polarity control signal REV, and a scanning control signal LS) and display signals RGB. Upon receiving these test control signals, the driver section 10 becomes able to be tested. Further, the burn-in control circuit 22 is logically designed to generate a desired test control signal upon receiving a clock signal.

In cases where the TESTEN signal and the NTEST signal are both High, a control burn-in operation is carried out. On this occasion, since the NTEST signal is High, the clock oscillation circuit 21 stops oscillating, and a TESTCK signal is inputted from an outside source (tester). The burn-in control circuit 22 generates a test control signal in accordance with the TESTCK signal, and outputs the test control signal to the driver section 10 via the control signal selection circuit 23.

Furthermore, when the liquid crystal driver 1 is in normal operation (when the liquid crystal driver 1 is actually used in a liquid crystal display device), the TESTEN signal and the NTEST signal are respectively fixed to Low and High, and no TESTCK signal is inputted. On this occasion, operation signals to the driver section 10 are inputted from logic input terminals to the driver section 10 via the control signal selection circuit 23. The logic input terminals are normal signal input terminals respectively allotted to various 1-bit control signals (e.g., a clock signal CK, a start pulse signal SP, a polarity control signal REV, and a scanning signal LS) and 1-bit display signals RGB.

The control signal selection circuit 23 chooses whether the test control signals generated by the burn-in control circuit 22 or the operation signals inputted from the logic input terminals are outputted to the driver section 10. That is, in a self burn-in test or a control burn-in test, the control signal selection circuit 23 outputs, to the driver section 10, the test control signals generated by the burn-in control circuit 22; when the liquid crystal driver 1 is in normal operation, the control signal selection circuit 23 outputs, to the driver section 10, the operation signals inputted from the logic input terminals. The control signal selection circuit 23 selects signals in accordance with the TESTEN signal and the NTEST signal.

Further, in a control burn-in test, the burn-in control circuit 22 operates in accordance with a TESTCK signal inputted from an outside source; in a self burn-in test, the burn-in control circuit 22 operates in accordance with an internal clock generated by the clock oscillation circuit 21. For this reason, a multiplexer 24 is provided right in front of the burn-in control circuit 22 so that a clock signal to be sent to the burn-in control circuit 22 is selected in accordance with the TESTEN signal.

In a control burn-in test in which the liquid crystal driver 1 serves as a DUT, a TESTCK signal inputted from an outside source is used as a test clock. This makes it easy to synchronize signals inputted to and outputted from a DUT, and makes it easy to synchronize, in cases where a multiple simultaneous test is conducted, signals respectively outputted from DUTs.

A merit of the liquid crystal driver 1 of the present embodiment lies in that: the number of signal inputs in conducting a burn-in test is reduced, and this reduction makes it possible to conduct a multiple simultaneous test with a reduced number of PEs of a probe card. This is fully explained below with reference to the drawings.

Figure 3:
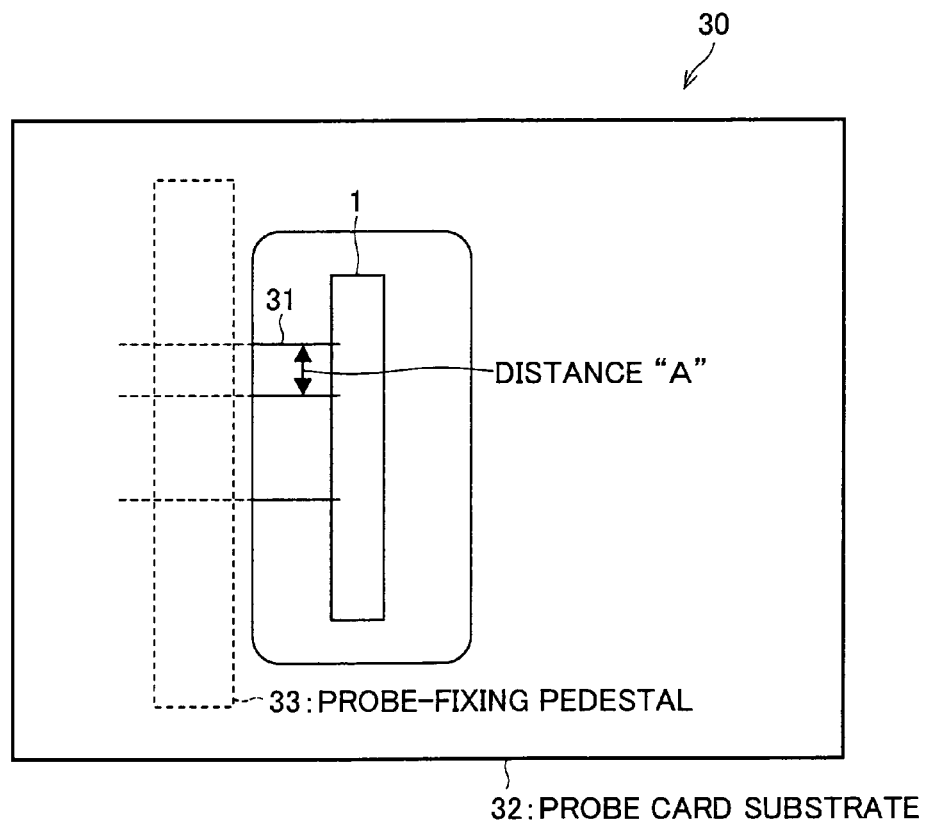
FIGS. 3(a) and 3(b) are diagrams showing a wafer probe card for use in a test on the liquid crystal driver.
Figure 3:
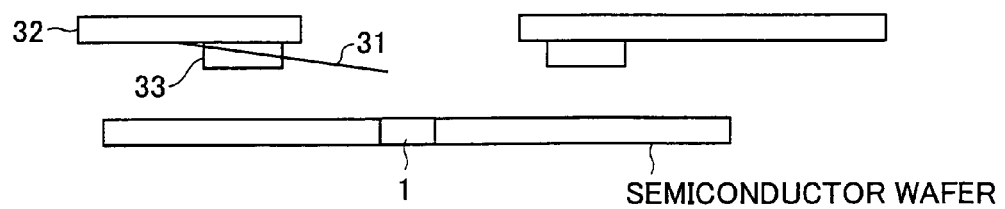

FIGS. 3(*a*) and 3(*b*) are diagrams showing a probe card 30 for testing the aforementioned liquid crystal driver 1 as a DUT. FIG. 3(*a*) is a top view of the probe card 30, and FIG. 3(*b*) is a side view of the probe card 30. The probe card 30 includes input-terminal-side probe needles 31, a probe card substrate 32, and a probe-fixing pedestal 33. In a test on the DUT, the input-terminal-side probe needles 31 for controlling the liquid crystal driver 1 are electrically connected to an external tester, and the DUT is subjected to an operation test. Note that the probe card substrate 32 is provided with an opening so that it becomes easy to align the probe needles with input pads of the DUT.

According to the liquid crystal driver 1 of the present invention including the test circuit 20, the test circuit 20 itself has a function of controlling the DUT. Therefore, it is only necessary to provide three input-terminal-side probe needles 31 respectively corresponding to the three terminals TESTEN, TESTCK, and NTEST.

As shown in FIGS. 3(*a*) and 3(*b*), the total of three input-terminal-side probe needles 31 are provided so as to correspond to a longer side of the DUT with a distance "A" secured therebetween. The pad layout of the DUT is designed so that the distance "A" is secured. The distance "A" refers to a distance between neighboring input-terminal-side probe needles 31.

The liquid crystal driver 1 is provided with pads respectively used as the three terminals TESTEN, TESTCK, and NTEST. As well, the liquid crystal driver 1 is provided with a normal-operation-mode control signal terminal pad. The pads for TESTEN, TESTCK, and NTEST are provided on a predetermined identical side of a semiconductor chip constituting the liquid crystal driver 1, and at least one normaloperation-mode control-signal-terminal pad is provided between one of the pads and another. With this, the distance "A" can be easily secured.

Figure 4:
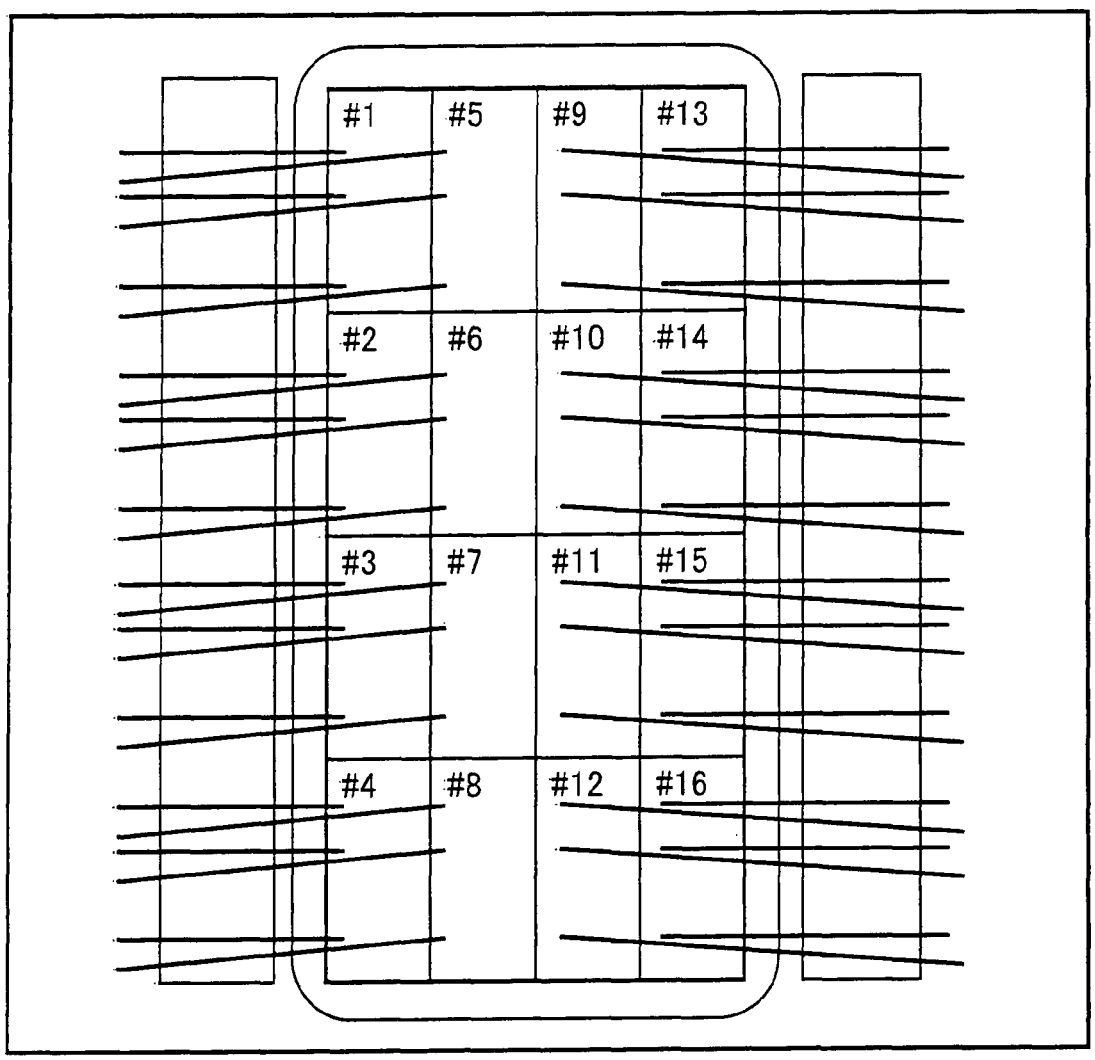
FIG. 4 is a diagram showing a wafer probe card for use in a simultaneous test on sixteen such liquid crystal drivers.

FIG. 4 is a diagram showing how a multiple simultaneous burn-in test is conducted under such conditions that a total of sixteen DUTs #1 to #16 disposed four by four on a semiconductor wafer are all brought into contact.

In cases where a burn-in test is conducted under such conditions that the DUTs are liquid crystal drivers 1, each of the DUT needs three control terminals, and it is necessary to provide a total of 48 probe needles 31 in order to bring all the sixteen DUTs into contact at once. In FIG. 4, probe needles are provided on the left side of the probe card substrate 32 so as to correspond to the left eight DUTs (#1 to #8). Further, probe needles are provided on the right side of the probe card substrate 32 so as to correspond to the right eight DUTs (#9 to #16).

Further, the probe needles 31 corresponding to the two central rows of DUTs (#5 to #12) are fixed to a probe-fixing pedestal so that the roots of the probe needles 31 are shifted in phase from those of the probe needles 31 corresponding to the two outer rows of DUTs (#1 to #4, #13 to #16). That is, the probe needles corresponding to the two central rows of DUTs (#5 to #12) and the probe needles 31 corresponding to the two outer rows of DUTs (#1 to #4, #13 to #16) are disposed so as not to overlap one another when seen from above (from the direction of a line normal to that surface of each of the DUTs on which the pads are disposed). The distance "A" between the pads of the DUT shown in FIGS. 3(a) and 3(b) is a distance for securing a sufficient amount by which a shift is made on this occasion.

Figure 5:
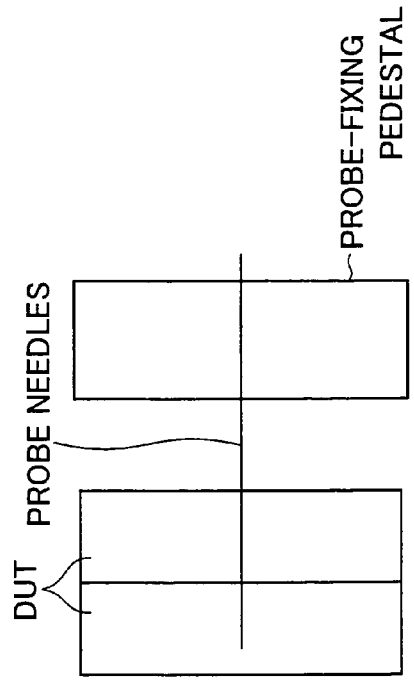
FIGS. 5(a) to 5(d) show how probe needles are structured in a wafer probe card for use in a simultaneous test on sixteen such liquid crystal drivers.
Figure 5:
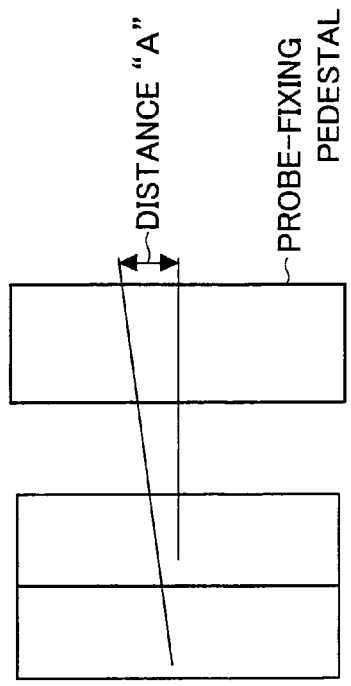
Figure 5:
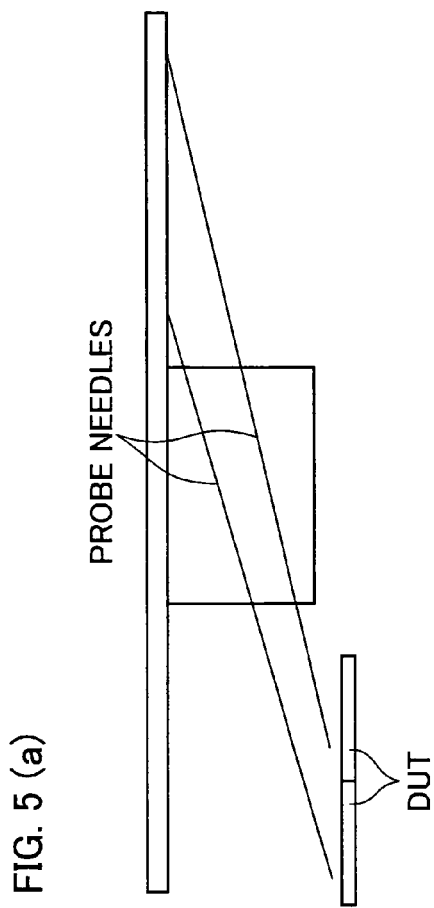
Figure 5:
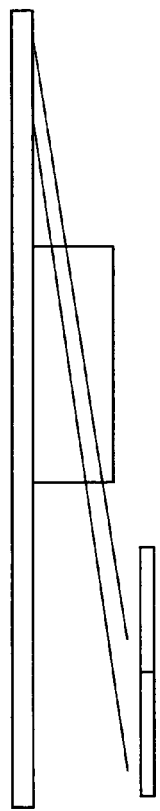

Thus, in cases where a multiple simultaneous test is conducted, probe needles for inputting test control signals to DUTs are disposed so as not to overlap one another when seen from above. This is effective in preventing interference among a large number of probe needles provided in a probe card. This is explained below with reference to FIGS. 5(a) to 5(d). Here, FIG. 5(a) is a side view obtained in cases where probe needles are so disposed as to overlap one another when seen from above, and FIG. 5(b) is a top view obtained in cases where probe needles are so disposed as to overlap one another when seen from above. FIG. 5(c) is a side view obtained in cases where probe needles are so disposed as not to overlap one another when seen from above, and FIG. 5(d) is a top view obtained in cases where probe needles are so disposed as not to overlap one another when seen from above. In the following description, the structure in which the probe needles are disposed so as to overlap one another when seen from above is referred to as "multilayer needle-fixed structure", and the structure in which the probe needles are disposed so as not to overlap one another when seen from above is referred to as "planar needle-fixed structure".

A comparison between FIG. 5(b) and FIG. 5(d) shows that a distance between probe needles can be wider in the planar needle-fixed structure in which the probe needles do not overlap one another when seen from above than in the multilayer needle-fixed structure in which the probe needles overlap one another when seen from above, and that interference between probe needles can therefore be prevented. On the contrary, a comparison between FIG. 5(a) and FIG. 5(c) shows that an attempt to secure a wide distance between probe needles in the multilayer needle-fixed structure causes an increase in the thickness and area of the probe card.

Further, the arrangement in which the probe needles 31 are prevented from overlapping one another in cases where a multiple simultaneous test is conducted may be an arrangement other than the arrangement, shown in FIG. 4, in which the roots of the probe needles are shifted in phase. This is explained below with reference to FIGS. 6 and 7.

Figure 6:
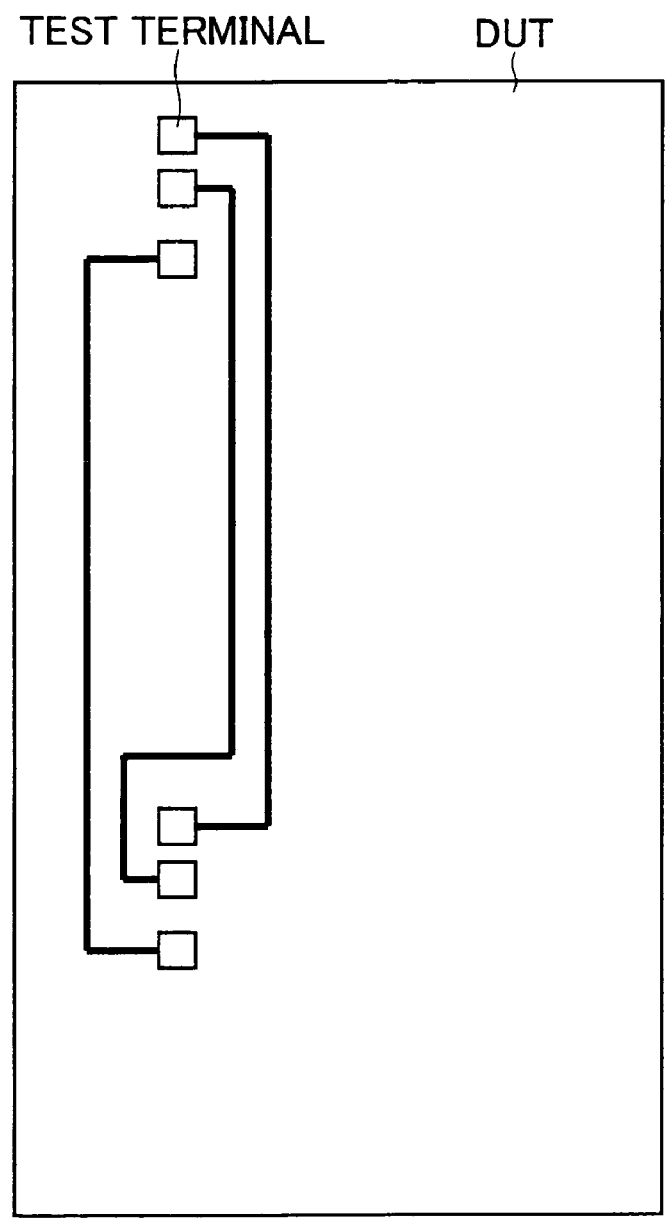
FIG. 6 is a plan view showing a modified example of how test terminals are disposed in a liquid crystal driver of the present invention.

FIG. 6 is a diagram showing how test terminals (input pads) are disposed in a DUT. Thus, the DUT shown in FIG. 6 is characterized by including two groups of test terminals. These two groups of terminals are disposed side by side along a longer side of the DUT chip, and each terminal is connected its corresponding terminal via an internal wire provided in the DUT. The DUT can be tested provided that either of the groups of terminals is probed. The DUT shown in FIG. 6 includes two groups of test terminals, but may include three or more groups of test terminals.

Figure 7:
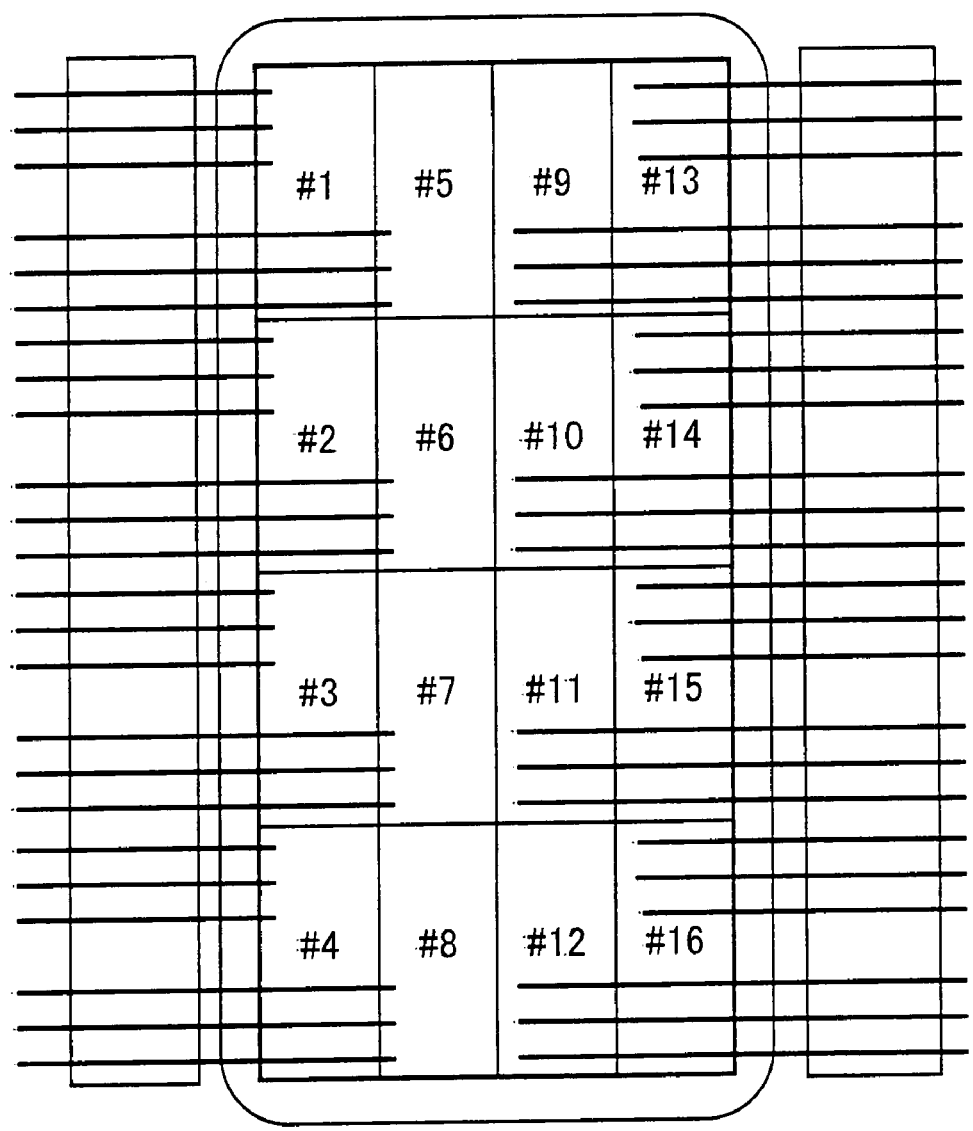
FIG. 7 is a diagram showing a wafer probe card for use in a simultaneous test on sixteen such liquid crystal drivers.

FIG. 7 shows how a multiple simultaneous burn-in test is conducted under such conditions that DUTs shown in FIG. 6 are disposed four by four on a semiconductor wafer. In FIG. 7, the sixteen DUTs are given reference numerals #1 to #16, respectively.

According to the disposition shown in FIG. 7, the central two rows of DUTs (#5 to #12) are each probed by using a group of terminals provided on a lower side of the chip, and the outer two rows of DUTs (#1 to #4, #13 to #16) are each probed by using a group of terminals provided on an upper side of the chip. According to this arrangement, all the probe needles of the probe card can be disposed so as to be parallel to one another. With this, the probe card is manufactured more easily than is a probe card, shown in FIG. 4, part of whose probe needles are disposed obliquely. Further, this prevents probe needles from being placed with a short distance therebetween. Furthermore, since the probe needles are not disposed obliquely, the probe needles do not need to be long, so that the probe needles become less likely to bend. Therefore, the probe needles become less likely to be electrically connected to each other in a short-circuit manner.

Since each of the probe cards explained in FIGS. 3 through 7 is supposed to be used in a burn-in test, the probe card includes only input-side probe needles. However, depending on the content of a test, the probe card may include output-side probe needles. Here, a liquid crystal driver normally has 384 to 720 output terminals, i.e., has more output terminals than input terminals. However, unlike input-side terminals, all the output terminals do not need to be probed. For this reason, by probing a small number of output terminals that have been randomly sampled, a multiple simultaneous test can be conducted even in cases where both input and output terminals are probed.

As described above, a burn-in test can be conducted by probing only input terminals. However, in cases where a burn-in test is conducted by probing only input terminals, an additional test needs to be conducted to discover a device in which a progressive defect has been revealed after the burn-in test. Therefore, in practice, it is preferable that a burn-in test be conducted under such conditions that output terminals are also probed. In cases where a multiple simultaneous test is conducted while probing output terminals, respective outputs of DUTs need to be synchronized. Therefore, in this case, the aforementioned control burn-in test is suitably applied.

Further, in cases where a probe card includes both input-side probe needles and output-side probe needles, it is conceivable, for example, that the input-side probe needles are disposed so as to correspond to one of the shorter sides of a DUT and that the output-side probe needles are disposed so as to correspond to the other one of the shorter sides of the DUT.

Further, another merit of the liquid crystal driver 1 of the present embodiment lies in that: since the aforementioned control burn-in test makes it easy to synchronize signals inputted to and outputted from the DUT, it becomes easy to control operation of the DUT in a test, so that a high-quality test can be conducted. This is fully described with reference to the drawings.

Figure 8:
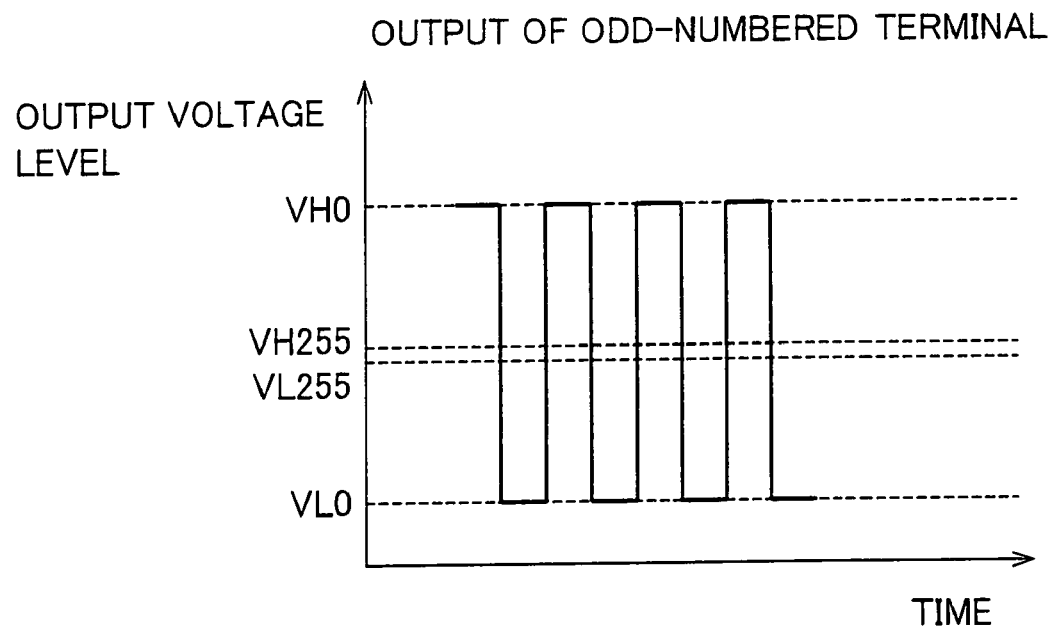
FIG. 8 is a diagram showing the state of output levels of the liquid crystal driver being subjected to a self burn-in test.
Figure 8:
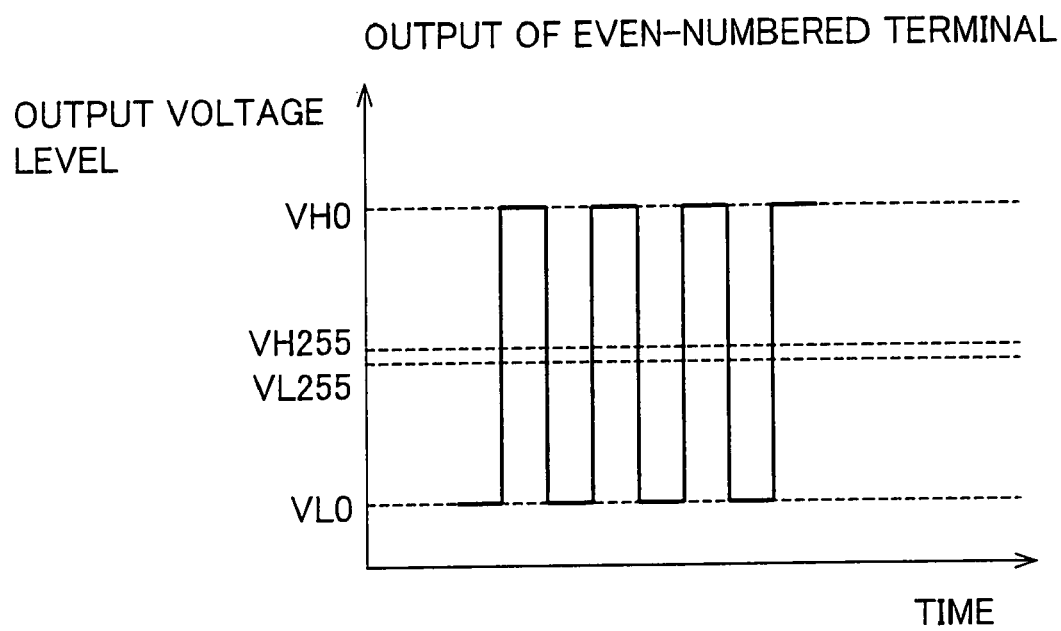

First, see FIG. 8, which shows the state of output voltage of the liquid crystal driver 1 being subjected to a self burn-in test. The liquid crystal driver 1 is a dot-inversion-type liquid crystal driver. Therefore, in FIG. 8, the output voltage of an odd-numbered terminal is opposite the output voltage of an even-numbered terminal in terms of polarity.

Each of the output voltages shown in FIG. 8 is at a gradation output level of VH0 or VL0, and the output voltage repeatedly changes from a voltage level of VH0 to a voltage level of VL0 and vice versa as time elapses. In a self burn-in test, it is impossible to select or output another gradation level. Further, as for the passage of time, since the control CK signal to the liquid crystal driver is generated from the CR oscillation circuit due to the self-oscillations, it is impossible to arbitrarily control the speed at which the inversion of the output voltages of the liquid crystal driver is repeated.

Further, on this occasion, operation of the liquid crystal driver is dominated by the control CK signal generated due to the self-oscillations of the CR oscillation circuit; therefore, it is impossible to arbitrarily stop the burn-in operation. Therefore, in cases where an attempt is made to monitor the operational state of a liquid crystal driver such as an output voltage in a burn-in operation carried out in a self burn-in test, the burn-in operation and the measurement cannot be not synchronized with each other, so that a monitoring (test) is impossible.

Figure 9:
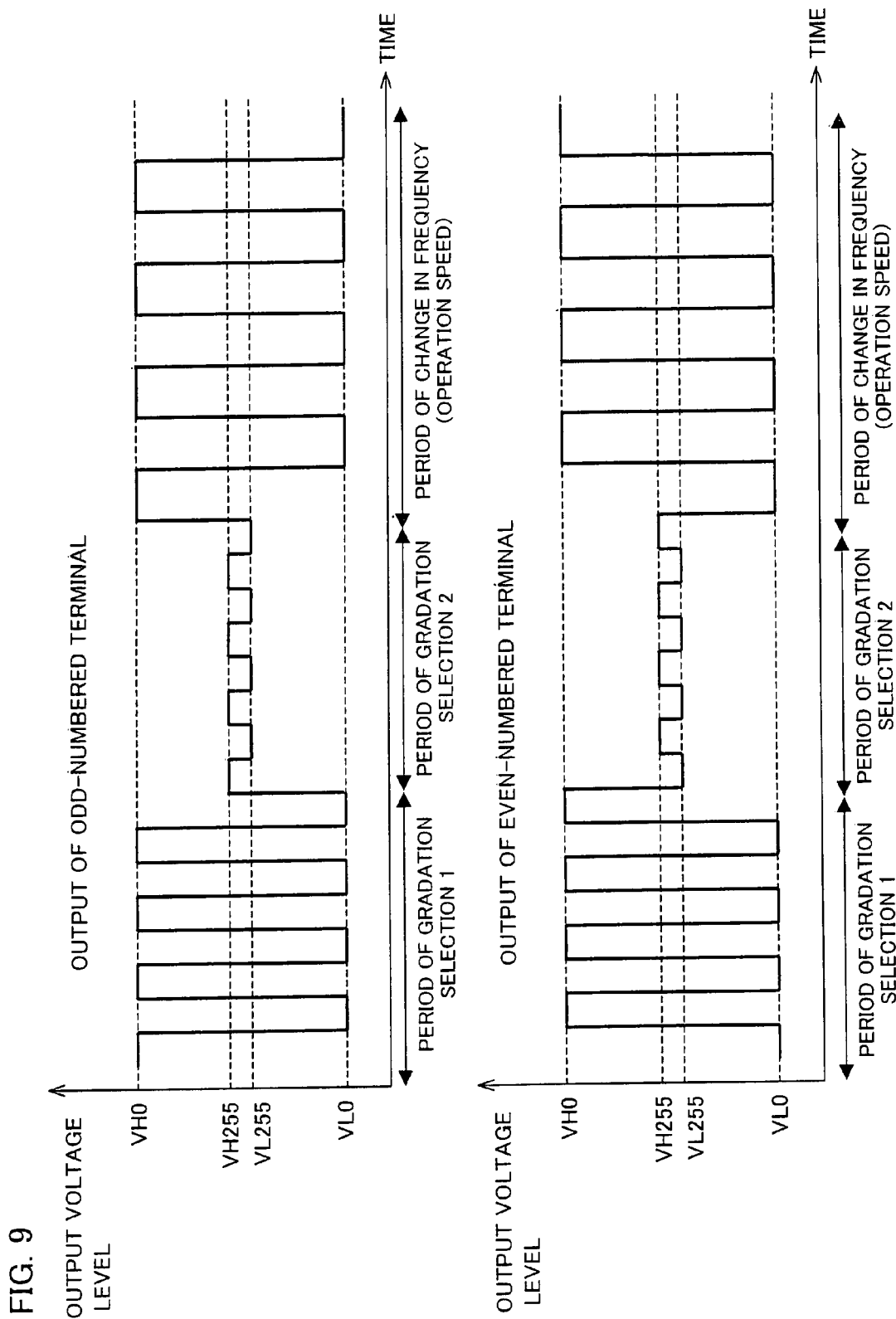
FIG. 9 is a diagram showing the state of output levels of the liquid crystal driver being subjected to a control burn-in test.

Next, see FIG. 9, which shows the state of output voltage of the liquid crystal driver 1 being subjected to a control burn-in test.

FIG. 9 shows a temporal change in the state of output voltages of the liquid crystal driver 1 with respect to the input of a TESTCK signal (the number of times the TESTCK signal is inputted). The upper waveform indicates a change in the state of output voltage of an odd-numbered terminal, and the lower waveform indicates a change in the state of output voltage of an even-numbered terminal. The output state of the odd-numbered terminal and the output state of the even-numbered terminal are determined with their respective polarities being always opposite each other.

In a test operation carried out in a control burn-in test, it is possible to select a gradation level and to control the number of times output inversion is repeated, operation time, operation speed, and the like. For example, in an example output shown in FIG. 9, during a period of gradation selection 1, input RGB data generated from the burn-in control circuit correspond to gradation output levels of VH0 and VL0. Moreover, as the TESTCK signal is further inputted (as the number of times the TESTCK signal is inputted is increased), a transition to a period of gradation selection 2 is made, so that the input RGB data generated by the burn-in control circuit are changed to correspond to gradation output levels of VH255 and VL255. Such a change in gradation output level during a test operation only needs to be logically designed in advance so as to be made in accordance with the number of times a clock is inputted to the burn-in control circuit.

Figure 10:
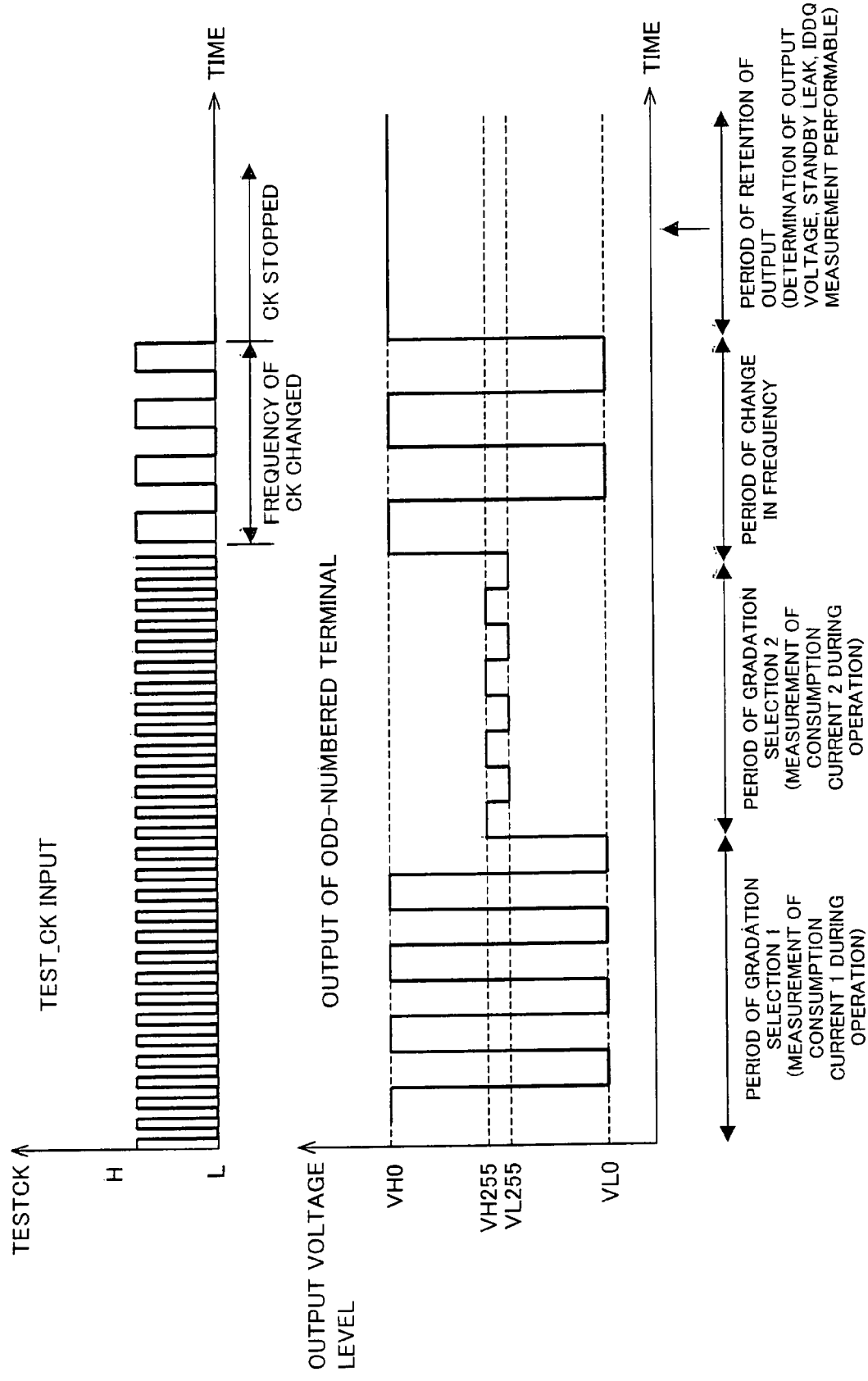
FIG. 10 shows a relationship between the frequency of a TESTCK signal and the frequency of a driver output.

Further, by changing the frequency of the TESTCK signal, a change in frequency (operation speed) can be made. FIG. 10 shows a relationship between the frequency of the TESTCK signal and the frequency of the driver output.

In a period of change in frequency (operation speed) during a test operation carried out in a control burn-in test, the input speed of the TESTCK signal is lower than in the period of gradation selection 1 and in the period of gradation selection 2, and the speed at which the output voltage of the DUT is changed can be changed depending on the frequency of the TESTCK input signal.

On this occasion, the relationship between the number of TESTCK signals and a single change in liquid crystal output is set to be synchronized with that of a conventional liquid crystal driver LSI. That is, the number of gradation data to be imported is determined in accordance with the number of liquid crystal driving output terminals of a DUT. Therefore, the number of TESTCK signals is determined in accordance with the number of gradation data to be imported.

That is, as in the period of retention of output state, a monitoring (test determination) of output voltage of the DUT can be carried out by stopping the TESTCK signal after the LS signal generated from the burn-in control circuit has been inputted. In addition, IDDQ measurement can be performed at any point, for example, in a period of import of DATA.

For example, the TESTCK signal is fixed to a high state or a low state by setting, to a desired state, a signal generated from the burn-in control circuit. With this, a rest power supply current can be measured. Further, after the rest power supply current is measured, the state is retained for a predetermined period of time. Thereafter, another rest power supply current is measured. With this, whether the semiconductor device is good or bad is determined in accordance with the size of a difference between the two rest power supply currents.

Figure 11:
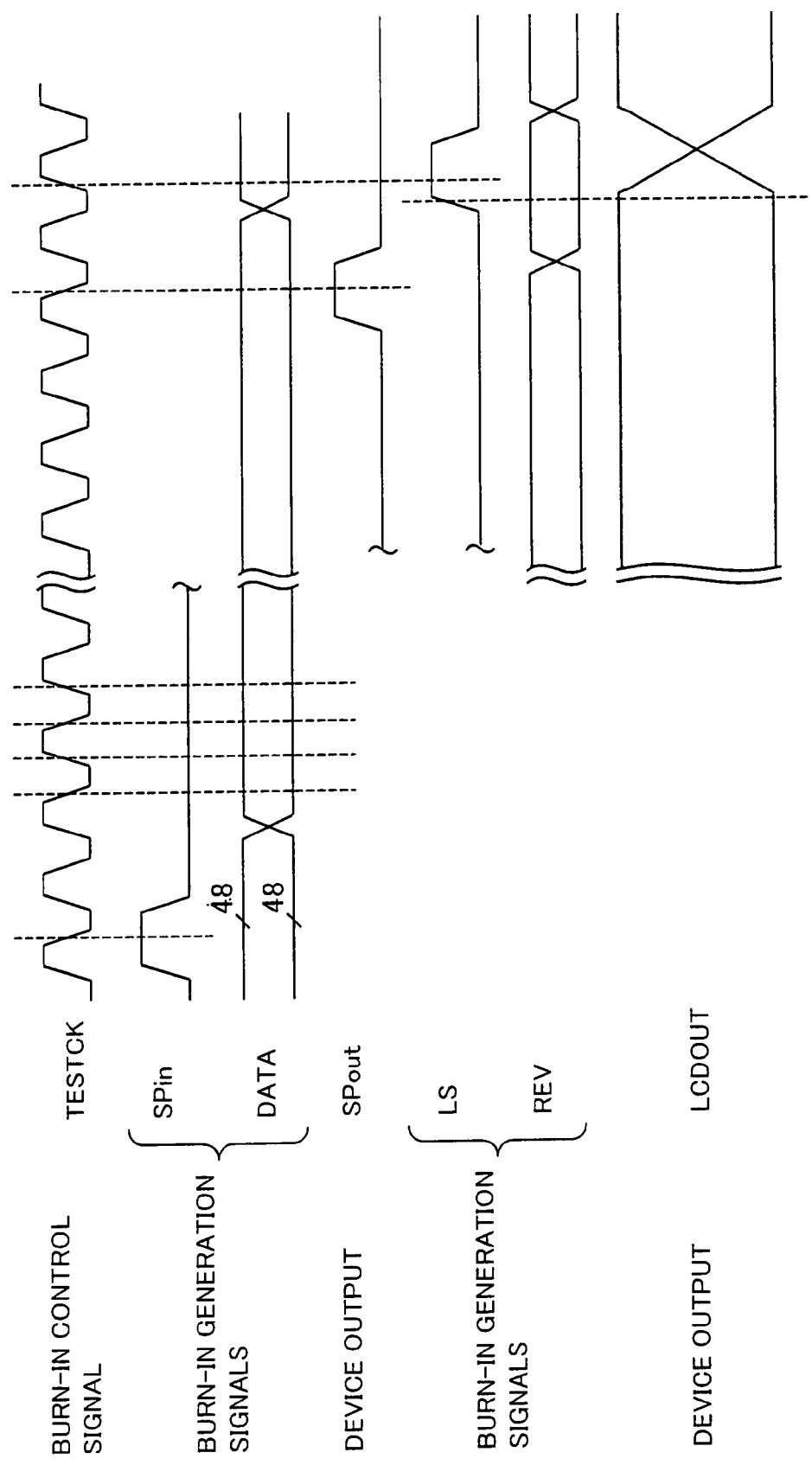
FIG. 11 is a diagram showing a relationship between a test control signal of the liquid crystal driver and changes in burn-in generation signals generated by a burn-in control circuit.
Figure 12:
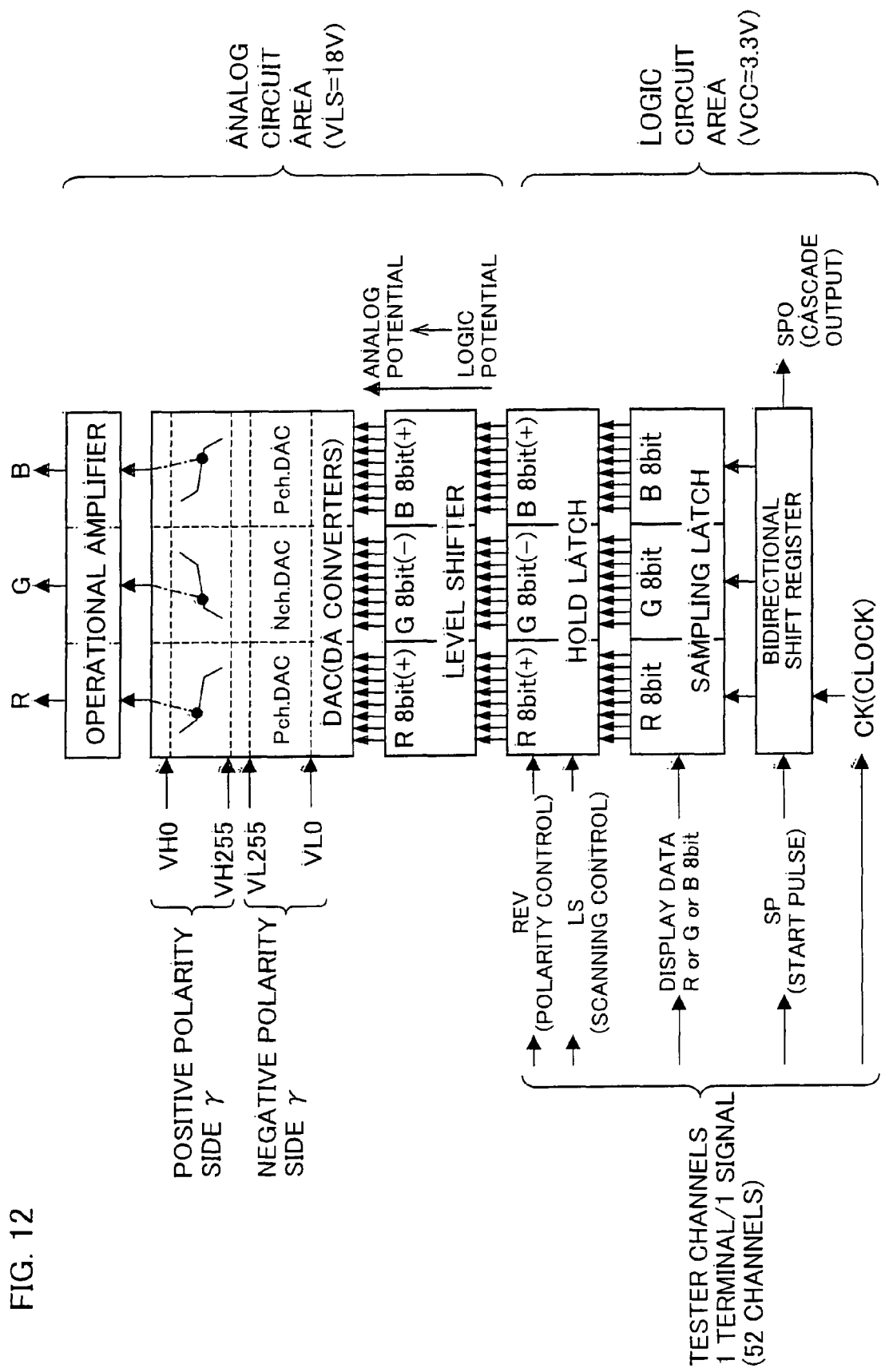
FIG. 12 is a block diagram showing a structure of a main part of a conventional liquid crystal driver.
Figure 13:
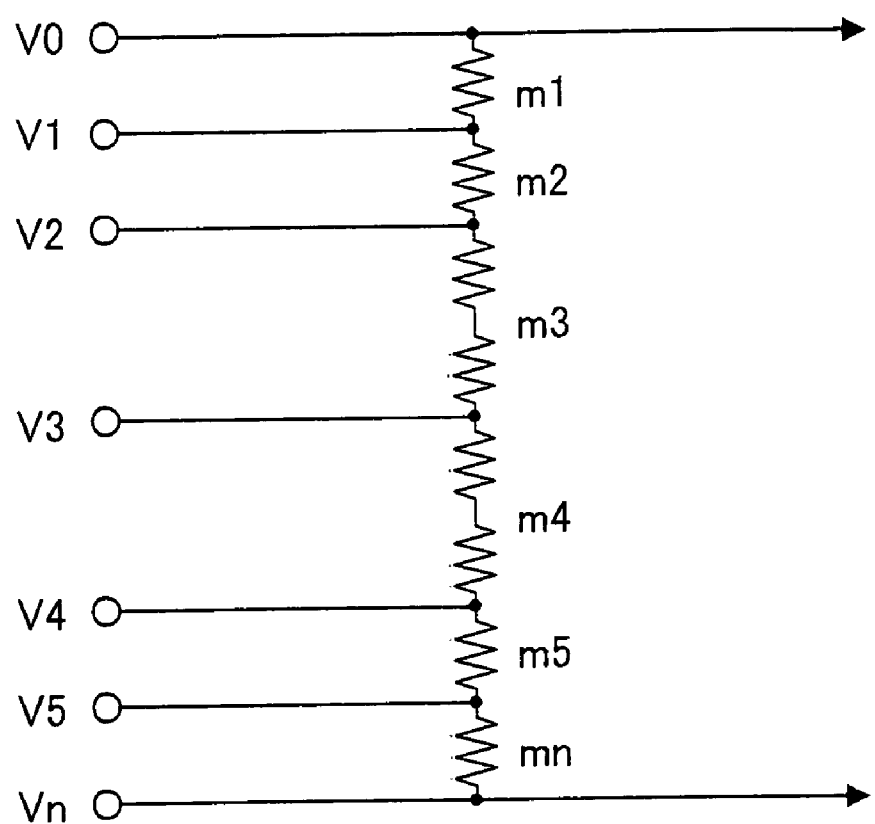
FIG. 13 is a diagram showing a ladder resistor for use as a reference voltage generation circuit.
Figure 14:
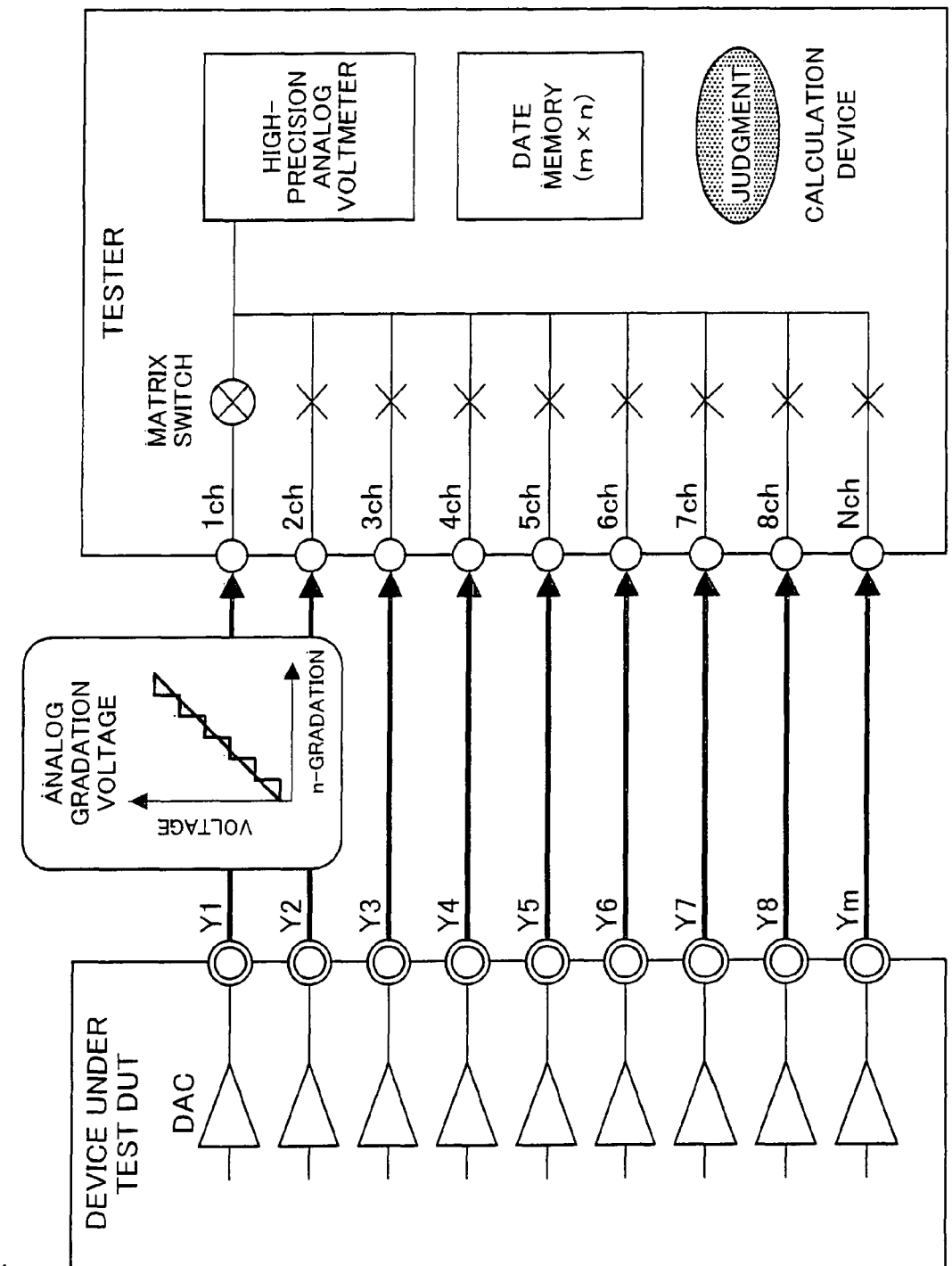
FIG. 14 is a diagram schematically showing a gradation testing method (system configuration) using a high-precision voltmeter.
Figure 15:
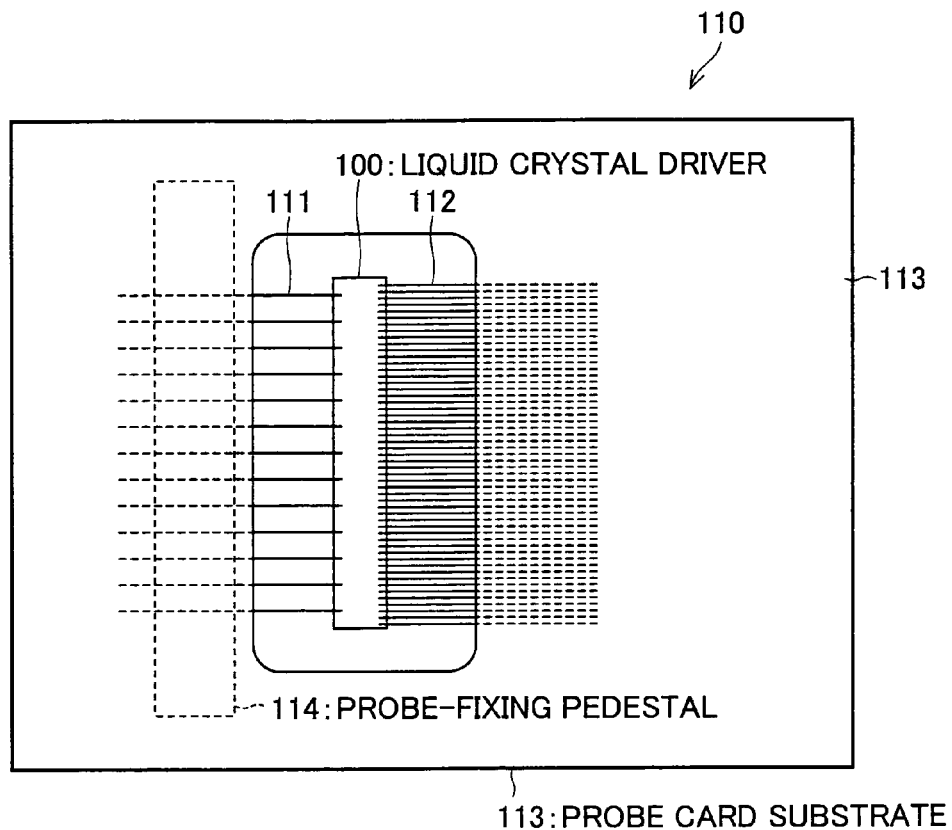
FIGS. 15(a) and 15(b) are diagrams showing a wafer probe card for use in a test on the conventional liquid crystal driver.
Figure 15:
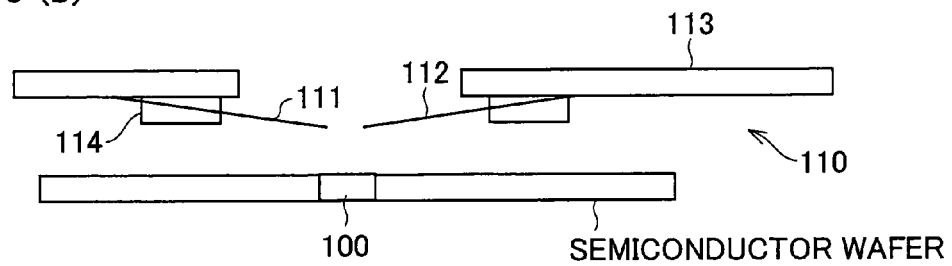
Figure 16:
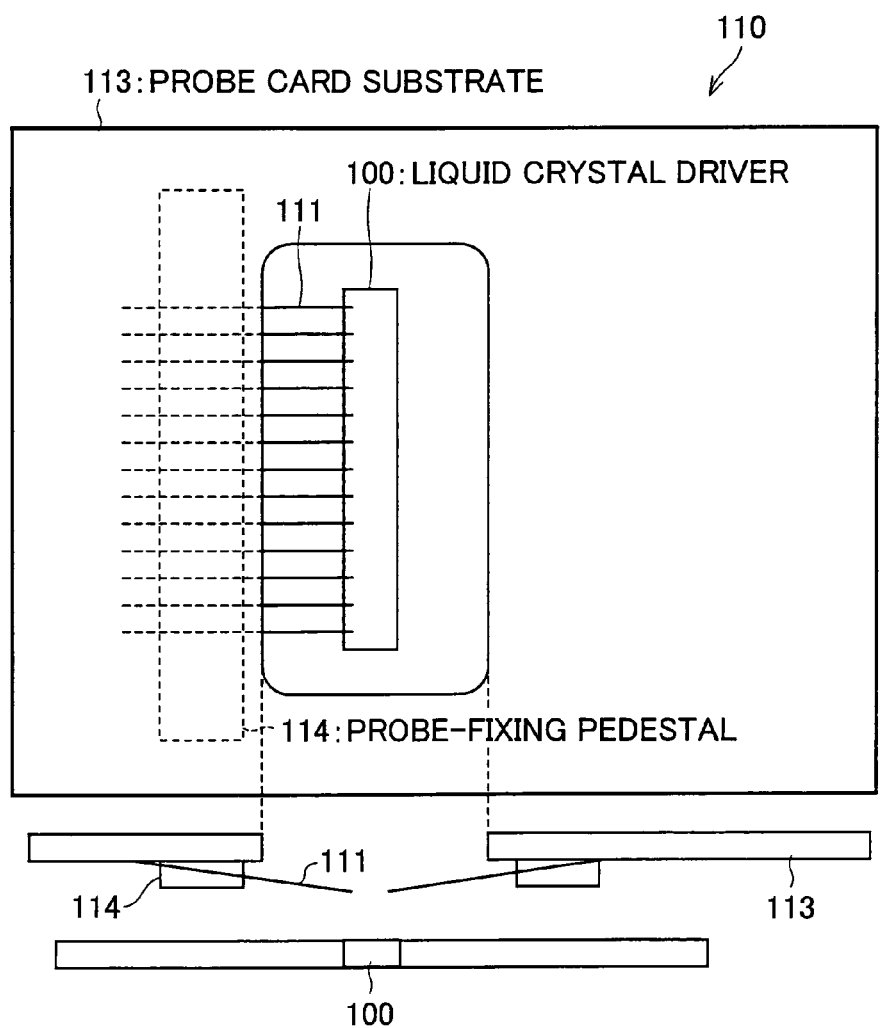
FIG. 16 is a diagram showing the wafer probe card for use in a test on the conventional liquid crystal driver.
Figure 17:
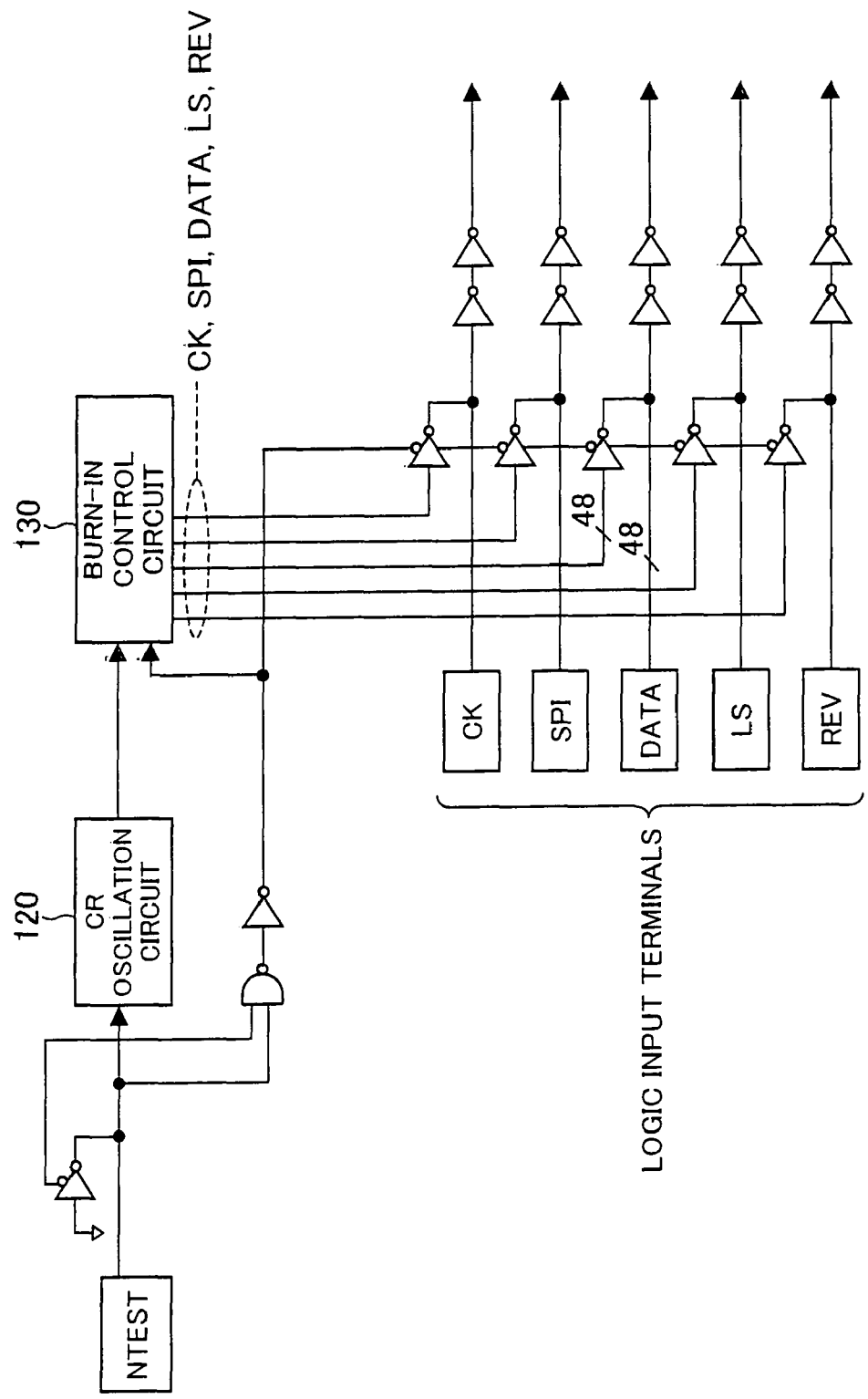
FIG. 17 is a diagram showing a structure of a test circuit contained in the conventional liquid crystal driver.

FIG. 11 is a diagram showing a relationship between a test control signal of the liquid crystal driver of the present invention and changes of burn-in generation signals generated by the burn-in control circuit.

FIG. 11 chronologically shows (i) the signals which are generated by the burn-in control circuit and inputted to the DUT in synchronization with the CK signal inputted from the TESTCK terminal and (ii) the output state of the DUT, in the burn-in control circuit diagram shown in FIG. 2. The burn-in generation signals SPIN, DATA, LS, REV and the DUT outputs SPOUT and LCDOUT each shown herein are identical in operation to those of a conventional liquid crystal driver LSI. The TESTCK signal is equivalent to a CK signal by which a conventional liquid crystal driver is operated. According to the present invention, since the TESTCK signal can be externally controlled, operation of the DUT can be monitored in real time.

The liquid crystal driver 1 thus explained can be subjected to two types of burn-in test, namely a self burn-in test and a control burn-in test. For this reason, the liquid crystal driver 1 has the clock oscillation circuit 21 and the NTEST terminal for use in a self burn-in test. However, the liquid crystal driver 1 is characterized by being able to be subjected to a control burn-in test, and even a liquid crystal driver on which only a control burn-in test can be conducted is encompassed in the scope of the present invention. A liquid crystal driver on which only a control burn-in test can be conducted does not need to have a clock oscillation circuit and an NTEST terminal.

As described above, a semiconductor device according to the present invention is a semiconductor device, including: a main operation section; and a test signal generating section for generating a test signal that is to be supplied to the main operation section when the main operation section is subjected to a quality determination test, the test signal generating section being capable of generating the test signal in accordance with a test enable signal and a clock signal each inputted from an outside source.

According to the foregoing arrangement, in cases where the semiconductor device is subjected to a quality determination test as a device under test (DUT), a test signal necessary for this quality determination test is generated by a test signal generating section. The test signal generating section is capable of generating the test signal in accordance with a test enable signal and a clock signal each supplied from an outside source. Therefore, in cases where the main operation section requires a large number of input signals for its operation, the number of test input signals can be greatly reduced. This makes it possible to solve such a problem that it becomes difficult to dispose probe needles in cases where a multiple simultaneous test is conducted.

Further, the test signal generating section operates in accordance with a clock signal supplied from an outside source, it is easy to synchronize signals inputted to and outputted from a DUT, and it is also easy to synchronize respective outputs of DUTs in cases where a multiple simultaneous test is conducted. When it becomes easy to synchronize signals inputted to and outputted from a DUT, it becomes easy to control operation of the DUT in a test. This makes it easy to conduct a high-quality quality determination test.

Further, the semiconductor device is preferably arranged so as to further include: a clock generating section for generating a clock signal, wherein the test signal generating section is capable of generating the test signal in accordance with the clock signal generated by the clock generating section.

According to the foregoing arrangement, the semiconductor device becomes able to be subjected to a quality determination test that is based on an external clock and a quality determination test that is based on an internal clock generated by the clock generating section, In a quality determination test that is based on an internal clock, it is possible to activate (operate) a circuit only by applying power and a burn-in enable signal (NTEST) to the circuit.

Further, the semiconductor device is preferably arranged such that terminal pads to be respectively used for the test enable signal and the clock signal are disposed along a longer side of a semiconductor element. Furthermore, the semiconductor device is preferably arranged such that terminal pads to be respectively used for the test enable signal and the clock signal are disposed so as to sandwich a normal-operation-mode control signal terminal pad therebetween.

Here, because of the layout of the semiconductor device, the terminal pads to be respectively used for the test enable signal and the clock signal are preferably disposed with a certain distance therebetween. This makes it easy to dispose probe needles especially in a probe card that is to be used when a multiple simultaneous test is conducted. Further, the semiconductor device is provided with a normal-operation-mode control signal terminal pad as well as the terminal pads that are to be respectively used for the test enable signal and the clock signal.

According to the foregoing arrangement, the terminal pads to be respectively used for the test enable signal and the clock signal can be easily disposed with a certain distance therebetween.

Further, the semiconductor device is preferably arranged so as to further include: a plurality of groups of terminal pads that are to be respectively used for the test enable signal and the clock signal, wherein each of the terminal pads is connected to its corresponding terminal pad via an internal wire provided in the semiconductor device.

According to the foregoing arrangement, if terminal pads to be used for a semiconductor device are different from terminal pads to be used for a semiconductor device adjacent to the semiconductor device, it is possible to prevent probe needles from making contact with each other in a probe card that is to be used when a multiple simultaneous test is conducted. This makes it easy to dispose the probe needles.

Further, the present invention can be applied, for example, to a case where the semiconductor device is a semiconductor device, such as a liquid crystal driver, which includes a large number of output terminals.

In order to solve the foregoing problems, a semiconductor device testing method according to the present invention is a method for testing a semiconductor device which includes (i) a main operation section and (ii) a test signal generating section for generating a test signal that is to be supplied to the main operation section when the main operation section is subjected to a quality determination test, the method including the steps of: inputting a test enable signal and a clock signal to the test signal generating section from an outside source; causing the test signal generating section to generate the test signal in accordance with the test enable signal and the clock signal; and conducting the quality determination test on the main operation section.

Further, the semiconductor device testing method is preferably arranged such that the quality determination test is conducted by measuring a rest power supply current.

Further, the semiconductor device testing method is preferably arranged such that the quality determination test is able to be simultaneously conducted on a plurality of semiconductor devices each of which is the foregoing semiconductor device.

Further, a probe card according to the present invention is a probe card to be used when a quality determination test is conducted on a semiconductor device which includes (i) a main operation section and (ii) a test signal generating section for generating a test signal that is to be supplied to the main operation section when the main operation section is subjected to the quality determination test, the test signal generating section of the semiconductor device being capable of generating the test signal in accordance with a test enable signal and a clock signal each inputted from an outside source, the probe card including probe needles for making contact with terminal pads that are to be respectively used for the test enable signal and the clock signal, the probe needles being disposed so as not to overlap one another when seen from a direction of a line normal to a surface of the semiconductor device on which surface the pads are disposed.

Examples of such an arrangement include an arrangement in which the probe needles are disposed so as to be parallel to one another when seen from the direction of the line normal to the surface of the semiconductor device on which surface the pads are disposed.

According to the foregoing arrangement, in cases where a multiple simultaneous test is conducted, probe needles via which a test control signal is inputted to a semiconductor device are disposed so as not to overlap one another when seen from above, so that a large number of probe needles provided in a probe card are effectively prevented from interfering with one another.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
a main operation section; and
a test signal generating section for generating a test signal that is to be supplied to the main operation section when the main operation section is subjected to a quality determination test,
the test signal generating section generates the test signal in accordance solely with a test enable signal and a clock signal each inputted from an outside source without receiving the input of the test signal from the outside source, and
the generated test signal being a plurality of control signals enabling the semiconductor device to be tested
the test signal generating section includes,
a burn-in control circuit configured to generate the test signal based solely on the test enable signal and the clock signal each separately inputted from one of the outside source without receiving the input of the test signal from the outside source, and
a control signal selection circuit configured to selectively output one of the test signal and an external logic input based on the test enable signal.

2. The semiconductor device as set forth in claim 1, further comprising:
a clock generating section for generating the clock signal, wherein
the test signal generating section is capable of generating the test signal in accordance with the clock signal generated by the clock generating section.

3. The semiconductor device as set forth in claim 1, further comprising: terminal pads to be used for the test enable signal and the clock signal are along a longer side of a semiconductor element.

4. The semiconductor device as set forth in claim 3, wherein terminal pads to be used for the test enable signal and the clock signal have a normal-operation-mode control signal terminal pad therebetween.

5. The semiconductor device as set forth in claim 1, further comprising:
a plurality of groups of terminal pads that are to be used for the test enable signal and the clock signal, wherein
each of the terminal pads is connected to its corresponding terminal pad via an internal wire provided in the semiconductor device.

6. The semiconductor device as set forth in claim 1, wherein the semiconductor device is a semiconductor device including a large number of output terminals.

7. The semiconductor device as set forth in claim 6, wherein the semiconductor device is a liquid crystal driver.

8. A method for testing a semiconductor device which includes a main operation section and a test signal generating section for generating a test signal that is to be supplied to the main operation section when the main operation section is subjected to a quality determination test, the method comprising:
inputting a test enable signal and a clock signal to the test signal generating section from an outside source without receiving the input of the test signal from the outside source;
generating the test signal by the test signal generating section solely in accordance with the test enable signal and the clock signal, the generated test signal being a plurality of control signals enabling the semiconductor device to be tested;
selectively outputting one of the test signal and an external logic input based on the test enable signal; and
conducting the quality determination test on the main operation section.

9. The method as set forth in claim 8, wherein the quality determination test is conducted by measuring a rest power supply current.

10. The method as set forth in claim 8, wherein said semiconductor device is one of a plurality of semiconductor devices and the quality determination test is able to be simultaneously conducted on said plurality of semiconductor devices.

* * * * *